(12) United States Patent
Kato et al.

(10) Patent No.: US 8,357,963 B2
(45) Date of Patent: Jan. 22, 2013

(54) SEMICONDUCTOR DEVICE

(75) Inventors: Kiyoshi Kato, Kanagawa (JP); Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 34 days.

(21) Appl. No.: 13/185,965

(22) Filed: Jul. 19, 2011

(65) Prior Publication Data

US 2012/0025284 A1 Feb. 2, 2012

(30) Foreign Application Priority Data

Jul. 27, 2010 (JP) .................................. 2010-167836

(51) Int. Cl.
*H01L 27/108* (2006.01)

(52) U.S. Cl. ........ 257/297; 257/296; 257/300; 257/547; 257/E29.28; 257/E29.296

(58) Field of Classification Search .................. 257/296, 257/297, 300, 547, E29.28, E29.296
See application file for complete search history.

(56) References Cited

U.S. PATENT DOCUMENTS

| | | | |
|---|---|---|---|
| 4,466,081 A | 8/1984 | Masuoka | |
| 5,712,817 A | 1/1998 | Suh | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,576,943 B1 | 6/2003 | Ishii et al. | |
| 6,727,522 B1 | 4/2004 | Kawasaki et al. | |
| 6,876,023 B2 | 4/2005 | Ishii et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

CN    1146605 A    4/1997

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Julio J Maldonado
*Assistant Examiner* — Jaehwan Oh
(74) *Attorney, Agent, or Firm* — Fish & Richardson P.C.

(57) ABSTRACT

A semiconductor device includes a material with which off-state current of a transistor can be sufficiently small; for example, an oxide semiconductor material is used. Further, transistors of memory cells of the semiconductor device, which include an oxide semiconductor material, are connected in series. Further, the same wiring (the j-th word line (j is a natural number greater than or equal to 2 and less than or equal to m)) is used as a wiring electrically connected to one of terminals of a capacitor of the j-th memory cell and a wiring electrically connected to a gate terminal of a transistor, in which a channel is formed in an oxide semiconductor layer, of the (j−1)-th memory cell. Therefore, the number of wirings per memory cell and the area occupied by one memory cell are reduced.

20 Claims, 11 Drawing Sheets

U.S. PATENT DOCUMENTS

| | | | |
|---|---|---|---|
| 7,132,713 B2 * | 11/2006 | Nakazato et al. | 257/329 |
| 7,211,825 B2 | 5/2007 | Shih et al | |
| 7,262,463 B2 | 8/2007 | Hoffman | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,564,055 B2 | 7/2009 | Hoffman | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,935,582 B2 | 5/2011 | Iwasaki | |
| 7,956,361 B2 | 6/2011 | Iwasaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2003/0227041 A1 | 12/2003 | Atwood et al. | |
| 2004/0038446 A1 | 2/2004 | Takeda et al. | |
| 2004/0127038 A1 | 7/2004 | Carcia et al. | |
| 2004/0164326 A1 | 8/2004 | Atwood et al. | |
| 2005/0017244 A1 | 1/2005 | Hoffman et al. | |
| 2005/0017302 A1 | 1/2005 | Hoffman | |
| 2005/0199959 A1 | 9/2005 | Chiang et al. | |
| 2005/0205921 A1 | 9/2005 | Ishii et al. | |
| 2005/0237786 A1 | 10/2005 | Atwood et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0267699 A1 | 11/2007 | Hoffman | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0276689 A1 | 11/2010 | Iwasaki | |
| 2010/0279462 A1 | 11/2010 | Iwasaki | |
| 2011/0101351 A1 | 5/2011 | Yamazaki | |
| 2011/0121286 A1 * | 5/2011 | Yamazaki et al. | 257/43 |
| 2011/0121878 A1 | 5/2011 | Kato et al. | |
| 2011/0122673 A1 | 5/2011 | Kamata et al. | |
| 2011/0128777 A1 | 6/2011 | Yamazaki et al. | |
| 2011/0134683 A1 * | 6/2011 | Yamazaki et al. | 365/149 |
| 2011/0193082 A1 | 8/2011 | Iwasaki | |
| 2011/0227062 A1 * | 9/2011 | Kato et al. | 257/43 |
| 2012/0012837 A1 * | 1/2012 | Yamazaki et al. | 257/43 |
| 2012/0012845 A1 * | 1/2012 | Kato et al. | 257/57 |
| 2012/0014157 A1 * | 1/2012 | Kato et al. | 365/72 |
| 2012/0032162 A1 * | 2/2012 | Matsubayashi | 257/43 |
| 2012/0032164 A1 * | 2/2012 | Ohnuki | 257/43 |

FOREIGN PATENT DOCUMENTS

| | | |
|---|---|---|
| CN | 1853278 A | 10/2006 |
| CN | 1906770 A | 1/2007 |
| CN | 101258607 A | 9/2008 |
| CN | 101859711 A | 10/2010 |
| EP | 0 053 878 A2 | 8/1985 |
| EP | 1 737 044 A1 | 12/2006 |
| EP | 2 226 847 A2 | 9/2010 |
| EP | 2 339 639 A2 | 6/2011 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 08-330445 A | 12/1996 |
| JP | 11-505377 A | 5/1999 |
| JP | 2000-044236 A | 2/2000 |
| JP | 2000-150900 A | 5/2000 |
| JP | 2000-269457 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-014094 A | 1/2004 |
| JP | 2004-103957 A | 4/2004 |
| JP | 2004-273614 A | 9/2004 |
| JP | 2004-273732 A | 9/2004 |
| JP | 2006-528843 A | 12/2006 |
| JP | 2007-103918 A | 4/2007 |
| JP | 2007-519256 A | 7/2007 |
| JP | 2010-183108 A | 8/2010 |
| KR | 0147352 B | 5/1998 |
| KR | 2006-0066064 A | 6/2006 |
| KR | 2006-0132659 A | 12/2006 |
| KR | 2008-0053355 A | 6/2008 |

| WO | 00/55920 A1 | 9/2000 |
| WO | 2004/114391 A1 | 12/2004 |
| WO | 2005/015643 A1 | 2/2005 |
| WO | 2005/074038 A1 | 8/2005 |
| WO | 2007/029844 A1 | 3/2007 |

OTHER PUBLICATIONS

Kim, W et al., "An Experimental High-Density DRAM Cell with a Built-in Gain Stage," IEEE Journal of Solid State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N. et al., "Crystallization and Reduction of sol-Gel-Derived Zinc Oxide Films by Irradiation With Ultraviolet Lamp," Journal of sol-Gel Science and Technology, 2003, vol. 26. pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase, Physics Letters", Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFSPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing M003 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N. et al., "Syntheses and Single-Crystal Data of Homologous Compounds, In2O3(ZnO)m (m =3, 4, and 5). InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K. et al., "Thin-Film Transistor Fabricated in Single-Crystalline Transparent Oxide Semiconductor, " Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA Amoled Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size Amoled," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA Amoled Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2011/066630, dated Aug. 30, 2011, 4 pages.

Written Opinion, PCT Application No. PCT/JP2011/066630, dated Aug. 30, 2011, 4 pages.

Kamiya, T et al., "Carrier Transport Properties and Electronic Structures of Amorphous Oxide Semiconductors: The Present Status," Kotai Butsuri (Solid State Physics), 2009, vol. 44, pp. 621-633 with English translation.

* cited by examiner

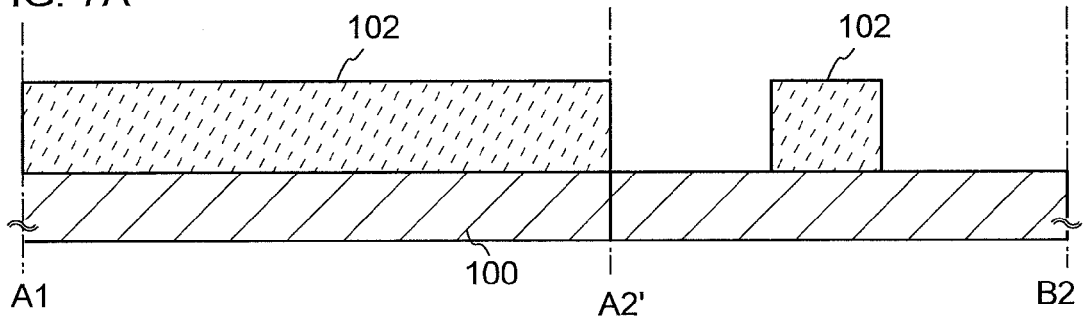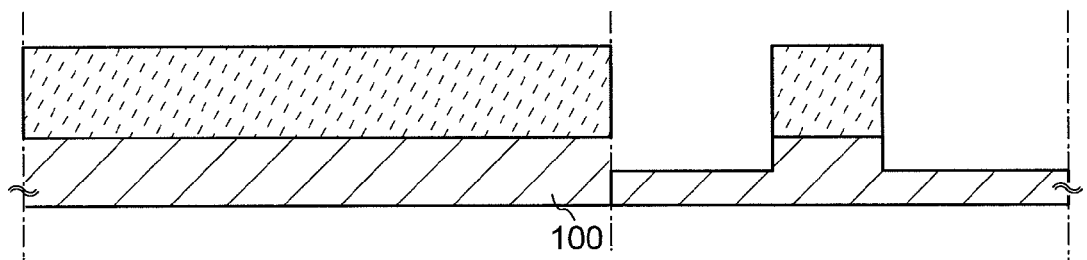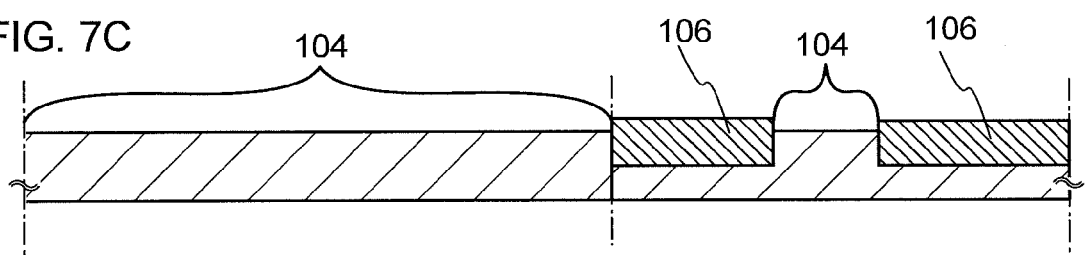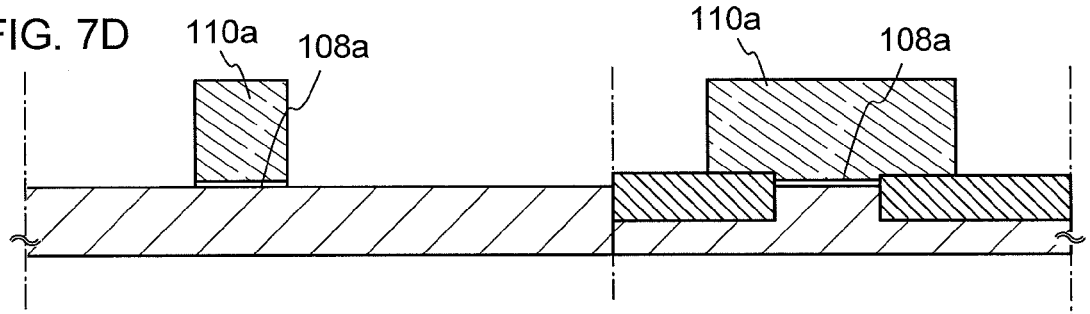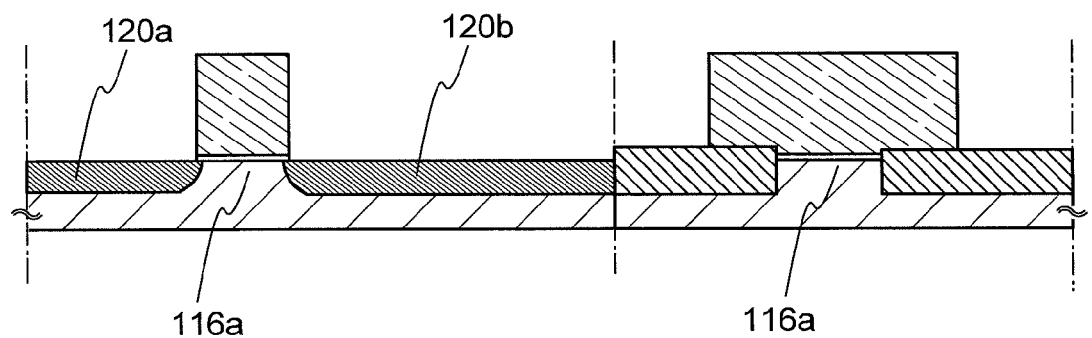

SEMICONDUCTOR DEVICE

TECHNICAL FIELD

The invention disclosed herein relates to semiconductor devices using semiconductor elements.

BACKGROUND ART

Storage devices using semiconductor elements are broadly classified into two categories: a volatile device that loses stored data when power supply stops, and a non-volatile device that retains stored data even when power is not supplied.

A typical example of a volatile memory device is a dynamic random access memory (DRAM). A DRAM stores data in such a manner that a transistor included in a storage element is selected and charge is accumulated in a capacitor.

In a DRAM, charge leaks from a capacitor of a storage element when data is read from the storage element; therefore, it is always necessary to write the data again to the storage element after the data is read from the storage element. By the off-state current (the leakage current flowing through a source and a drain of a transistor which is off) of the transistor of the storage element, or the like, charge flows out from/in the capacitor even when the transistor is not selected; therefore, a data holding period of the storage element is short. For that reason, operation of writing data to the storage element (refresh operation) is needed to be performed at predetermined intervals, and it is difficult to sufficiently reduce power consumption of a DRAM. Furthermore, since stored data is lost when power supply to a DRAM stops, an additional storage device using a magnetic material or an optical material is needed in order to hold data for a long time.

An example of a volatile memory device other than a DRAM is a static random access memory (SRAM). An SRAM retains stored data by using a circuit such as a flip-flop and thus does not need refresh operation. In that respect, an SRAM has an advantage over a DRAM. However, in an SRAM, cost per storage capacity is increased because a circuit such as a flip-flop is used. Further, in an SRAM, stored data is lost when power is not supplied as in a DRAM.

A typical example of a non-volatile memory device is a flash memory. As a storage element, a flash memory includes a transistor (hereinafter, referred to as a floating-gate transistor) in which a floating gate is provided between a gate electrode and a channel formation region. The storage element of a flash memory stores data by holding charge in the floating gate. Therefore, a flash memory is advantageous in that a data holding period is very long (semipermanent) and no need of refresh operation which a volatile memory device needs (e.g., see Patent Document 1).

However, a gate insulating layer of a floating-gate transistor included in the storage element deteriorates because of tunnel current generated at the time of writing data. Therefore, the following problem occurs: the storage element does not work because of deterioration after data is written to the storage element predetermined times. In order to alleviate this problem, a method in which the number of writing of data operations is equalized among a plurality of storage elements included in a flash memory can be employed, for example, but a complex peripheral circuit is needed to realize this method. Further, even if such a method is employed, the basic problem of a short lifetime of the storage element is not resolved. In other words, a flash memory is not suitable for applications in which data is frequently rewritten.

Further, a floating-gate transistor needs high voltage in order to hold charge in a floating gate or to remove charge held in the floating gate. A circuit which is appropriate for using high voltage is needed in addition to a floating-gate transistor. Furthermore, a floating-gate transistor needs a relatively long time for holding charge in the floating gate or removing charge from the floating gate. Therefore, there is also a problem in that it is difficult to write and erase data at high speed.

REFERENCE

[Patent Document 1] Japanese Published Patent Application No. S57-105889

DISCLOSURE OF INVENTION

In view of the foregoing problems, an object is to provide a semiconductor device with a novel structure in which stored data can be held even when power is not supplied, and there is no limitation on the frequency of writing data. Further, another object is to increase the degree of integration of the semiconductor device having the novel structure and increase the storage capacity per unit area.

In an embodiment of the disclosed invention, each memory cell included in a semiconductor device includes a capacitor and a transistor having small off-state current (leakage current between a source and a drain of a transistor in an off-state). A transistor having small off-state current can be a transistor including an oxide semiconductor material which is a wide-gap semiconductor. Note that a transistor including an oxide semiconductor material is a transistor in which a channel is formed in a layer including an oxide semiconductor material (an oxide semiconductor layer).

In an embodiment of the invention disclosed herein, a memory cell included in a semiconductor device includes a capacitor and a transistor including an oxide semiconductor material. In a plurality of adjacent memory cells, the transistors (the transistors including an oxide semiconductor material) are electrically connected in series. Thus, a source electrode of a transistor which includes an oxide semiconductor material and is included in a memory cell, and a drain electrode of an adjacent transistor which includes an oxide semiconductor material and is included in a memory cell, can be in contact with each other, or the source electrode of the transistor can function as the drain electrode of the adjacent transistor.

That is to say, the semiconductor device includes two adjacent memory cells, and a transistor which includes an oxide semiconductor material and is included in one of the two memory cells and a transistor which includes an oxide semiconductor material and is included in the other of the two memory cells are connected in series. A source electrode of the transistor which includes an oxide semiconductor material and is included in the one of the memory cells is in contact with a drain electrode of the transistor which includes a semiconductor material and is included in the other of the memory cells, or the source electrode of the transistor of one memory cell can function as the drain electrode of the transistor of the adjacent memory cell.

An embodiment of the invention disclosed herein is a semiconductor device including a source line, a bit line, (m+1) word lines (m is a natural number greater than or equal to 2), a selection line, a first to an m-th memory cells connected in series between the source line and the bit line, and a selection transistor, a gate terminal of which is electrically connected to the selection line. Each of the first to the m-th memory cells includes a first transistor including a first gate terminal, a first source terminal, and a first drain terminal, a second transistor including a second gate terminal, a second source terminal, and a second drain terminal, and a capacitor. The second transistor includes an oxide semiconductor layer. A channel of the second transistor is formed in the oxide semiconductor layer. The source line is electrically connected to the first source terminal of the m-th memory cell through the selection transistor. The bit line is electrically connected to the second drain terminal of the first memory cell and the first drain terminal of the first memory cell. A k-th word line (k is a natural number greater than or equal to 1 and less than or equal to m) is electrically connected to the second gate terminal of a k-th memory cell. A (k+1)-th word line is electrically connected to one of terminals of the capacitor of the k-th memory cell. The second drain terminal of a j-th memory cell (j is a natural number greater than or equal to 2 and less than or equal to m) is electrically connected to the first gate terminal of a (j−1)-th memory cell, the second source terminal of the (j−1)-th memory cell, and the other of the terminals of the capacitor of the (j−1)-th memory cell. The first gate terminal of the m-th memory cell, the second source terminal of the m-th memory cell, and the other of the terminals of the capacitor of the m-th memory cell are electrically connected to one another. The first drain terminal of the j-th memory cell is electrically connected to the first source terminal of the (j−1)-th memory cell.

Another embodiment of the invention disclosed herein is a semiconductor device including a source line, a bit line, (m+1) word lines (m is a natural number greater than or equal to 2), a first selection line, a second selection line, a first to an m-th memory cells connected in series between the source line and the bit line, a first selection transistor, a gate terminal of which is electrically connected to the first selection line, and a second selection transistor, a gate terminal of which is electrically connected to the second selection line. Each of the first to the m-th memory cells includes a first transistor including a first gate terminal, a first source terminal, and a first drain terminal, a second transistor including a second gate terminal, a second source terminal, and a second drain terminal, and a capacitor. The second transistor includes an oxide semiconductor layer. A channel of the second transistor is formed in the oxide semiconductor layer. The source line is electrically connected to the first source terminal of the m-th memory cell through the second selection transistor. The bit line is electrically connected to the second drain terminal of the first memory cell and is electrically connected to the first drain terminal of the first memory cell through the first selection transistor. A k-th word line (k is a natural number greater than or equal to 1 and less than or equal to m) is electrically connected to the second gate terminal of a k-th memory cell, and a (k+1)-th word line is electrically connected to one of terminals of the capacitor of the k-th memory cell. The second drain terminal of a j-th memory cell (j is a natural number greater than or equal to 2 and less than or equal to m) is electrically connected to the first gate terminal of a (j−1)-th memory cell, the second source terminal of the (j−1)-th memory cell, and the other of the terminals of the capacitor of the (j−1)-th memory cell. The first gate terminal of the m-th memory cell, the second source terminal of the m-th memory cell, and the other of the terminals of the capacitor of the m-th memory cell are electrically connected to one another. The first drain terminal of the j-th memory cell is electrically connected to the first source terminal of the (j−1)-th memory cell.

The first transistor can be a transistor including a material other than an oxide semiconductor. As an example, the first transistor includes a channel formation region that is provided in a substrate including a semiconductor material other than an oxide semiconductor, a pair of impurity regions between which the channel formation region is provided, a first gate insulating layer that is provided over the channel formation region, and a first gate electrode that overlaps the channel formation region and is provided over the first gate insulating layer. As another example, the first transistor is provided over an insulating surface and includes a channel formation region that is provided in a semiconductor layer including a semiconductor material other than an oxide semiconductor, a pair of impurity regions between which the channel formation region is provided, a first gate insulating layer that overlaps the channel formation region, and a first gate electrode that is provided to overlap the channel formation region with the first gate insulating layer provided therebetween. Here, one of the pair of impurity regions is a source and the other is drain. Note that one of the pair of impurity regions may be a first source electrode and the other may be a first drain electrode, and alternatively, an electrode that is electrically connected to one of the pair of impurity regions may be a first source electrode and an electrode that is electrically connected to the other may be a first drain electrode. The first gate electrode is a first gate terminal of the transistor, the first source electrode is a first source terminal of the transistor, and the first drain electrode is a first drain terminal of the transistor.

The second transistor includes a second source electrode and a second drain electrode that are electrically connected to an oxide semiconductor layer, a second gate insulating layer, and a second gate electrode that is provided to overlap the oxide semiconductor layer with the second gate insulating layer provided therebetween. The second gate electrode is a second gate terminal of the transistor, the second source electrode is a second source terminal of the transistor, and the second drain electrode is a second drain terminal.

Note that a second drain electrode of the j-th memory cell and a second source electrode of the (j−1)-th memory cell can be formed using one conductive layer. Alternatively, the second drain electrode of the j-th memory cell, the second source electrode of the (j−1)-th memory cell, and the other of the terminals of the capacitor of the (j−1)-th memory cell can be formed using one conductive layer. Alternatively, the second drain electrode of the j-th memory cell, the second source electrode of the (j−1)-th memory cell, the other of the terminals of the capacitor of the (j−1)-th memory cell, and the first gate electrode of the (j−1)-th memory cell can be formed using one conductive layer. That is to say, all of or some of the second drain electrode of the j-th memory cell, the second source electrode of the (j−1)-th memory cell, the other of the terminals of the capacitor of the (j−1)-th memory cell, and the first gate electrode of the (j−1)-th memory cell can be formed using one conductive layer.

Note that the substrate including the semiconductor material is preferably a single crystal semiconductor substrate or an SOI substrate. It is preferable that the semiconductor material be silicon. The oxide semiconductor layer preferably includes an oxide semiconductor material containing In, Ga, and Zn.

Note that in the above description, a material, which can realize the off-state current characteristics equivalent to those of the oxide semiconductor material such as a wide gap material like silicon carbide (specifically, a semiconductor material whose energy gap Eg is larger than 3 eV) may be used, instead of an oxide semiconductor material.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" includes a case in which a plurality of "electrodes" or "wirings" is formed in an integrated manner.

Functions of a "source" and a "drain" are sometimes replaced with each other when a transistor of opposite polarity is used or when the direction of current flowing is changed in accordance with circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on the object having any electric function as long as electric signals can be transmitted and received between the components connected through the object. Examples of an "object having any electric function" are a switching element such as a transistor, a resistor, an inductor, a capacitor, and an element with a variety of functions as well as an electrode and a wiring.

A transistor in which a channel is formed in an oxide semiconductor layer has extremely small off-state current. Therefore, by using the transistor for each memory cell, charge flowing out from/to a capacitor in the case where the transistor is not selected can be reduced. As a result, a semiconductor device can hold stored data for an extremely long time. In other words, the semiconductor device needs no refresh operation or needs refresh operation at extremely low frequency. Thus, power consumption of the semiconductor device can be sufficiently reduced. Further, the semiconductor device can hold stored data for a long time even in the case where power is not supplied to the semiconductor device (note that it is preferable that a potential supplied to the semiconductor device may not be varied between the case where power is supplied and the case where power is not supplied).

Further, in a semiconductor device according to an embodiment of the invention disclosed herein, elements included in the semiconductor device hardly deteriorate because high voltage is not needed to write data to each memory cell. In the case of a conventional flash memory, as an example, there is a problem of deterioration of a gate insulating layer of a transistor because it is necessary that high voltage be applied to an element of a floating-gate transistor or the like included in a semiconductor device in order to inject or draw electrons to/from a floating gate. On the other hand, in a semiconductor device according to an embodiment of the invention disclosed herein, unlike a conventional flash memory, a gate insulating layer of a transistor hardly deteriorates because it is not necessary that high voltage be applied to an element, such as a transistor or the like, included in a semiconductor device. That is to say, the semiconductor device according to an embodiment of the invention disclosed herein has no limitation on the number of times of rewriting, which is a problem of a conventional non-volatile memory device, and reliability thereof is drastically improved. Further, high-speed operation of a semiconductor device according to an embodiment of the invention disclosed herein can be easily realized because data is written to each memory cell by controlling the on/off of a transistor included in the semiconductor device.

Further, a transistor including a material other than an oxide semiconductor (e.g., a transistor in which a channel is formed in a silicon substrate or a silicon layer) can operate at higher speed than a transistor including an oxide semiconductor material (a transistor in which a channel is formed in an oxide semiconductor layer). Therefore, the operation of the semiconductor device can be performed at high speed by using a combination of a transistor including a material other than an oxide semiconductor and a transistor including an oxide semiconductor material. Furthermore, a transistor including a material other than an oxide semiconductor can preferably realize circuits (e.g., a logic circuit and a driver circuit) in a semiconductor device, which are required to operate at high speed.

Thus, a semiconductor device having a novel feature can be realized by provision of both the transistor including a material other than an oxide semiconductor (and more broadly, a transistor capable of operation at sufficiently high speed) and the transistor including an oxide semiconductor material (and more broadly, a transistor whose off-state current is sufficiently small).

Further, in a semiconductor device according to an embodiment of the invention disclosed herein, by series connection of transistors including an oxide semiconductor material and included in memory cells of a semiconductor device, a source electrode of a transistor which includes an oxide semiconductor material and is included in a memory cell, and a drain electrode of an adjacent transistor which includes an oxide semiconductor material and is included in a memory cell, can be in contact with each other, or the source electrode of the transistor can function as the drain electrode of the adjacent transistor. Here, in the case where transistors including an oxide semiconductor material and included in memory cells are not electrically connected in series, an opening needs to be provided in an interlayer insulating film or the like in order that one of a source electrode and a drain electrode of the transistor may be connected to a wiring provided in a layer which is not a layer provided with the one of the source electrode and the drain electrode. Therefore, the large area is needed for wiring connection in a memory cell. On the other hand, as in a semiconductor device according to an embodiment of the invention disclosed herein, transistors including an oxide semiconductor material and included in adjacent memory cells are electrically connected in series, so that a source electrode of a transistor which includes an oxide semiconductor material and is included in a memory cell, and a drain electrode of an adjacent transistor which includes an oxide semiconductor material and is included in a memory cell, can be in contact with each other, or the source electrode of the transistor can function as the drain electrode of the adjacent transistor; therefore, the area occupied by one memory cell can be reduced. Accordingly, the degree of integration of the semiconductor device can be increased, and the storage capacity per unit area can be increased.

Moreover, a semiconductor device according to an embodiment of the invention disclosed herein has a structure in which the k-th word line (k is a natural number greater than or equal to 1 and less than or equal to m) is electrically connected to a second gate terminal of the k-th memory cell and the (k+1)-th word line is electrically connected to one of terminals of a capacitor of the k-th memory cell. Therefore, one wiring, that is, the same wiring (the j-th word line) (j is a natural number greater than or equal to 2 and less than or equal to in) functions as both a wiring which is electrically connected to the one of the terminals of the capacitor of the (j−1)-th memory cell and a wiring which is electrically connected the second gate terminal of the j-th memory cell.

Accordingly, the number of wirings per memory cell and the area occupied by one memory cell can be reduced. In such a manner, the degree of integration of the semiconductor device can be increased, and the storage capacity per unit area can be increased.

BRIEF DESCRIPTION OF DRAWINGS

FIGS. 7A to 7E are diagrams illustrating a method for manufacturing a semiconductor device.

BEST MODE FOR CARRYING OUT THE INVENTION

Figure 1A:
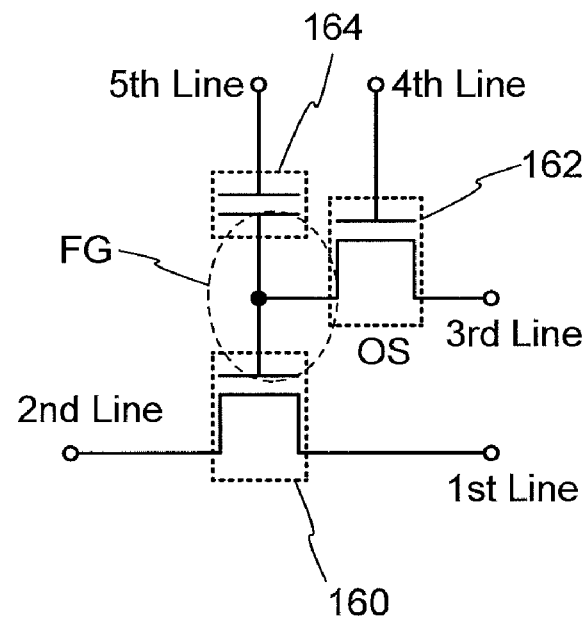
FIGS. 1A and 1B are circuit diagrams of a semiconductor device.

Examples of embodiments of the invention disclosed herein will be described below with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments.

Note that the position, the size, the range, or the like of each structure illustrated in drawings and the like is not accurately represented in some cases for easy understanding. Therefore, the invention disclosed herein is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a circuit configuration and operation of a semiconductor device according to an embodiment of the invention disclosed herein will be described with reference to FIGS. 1A and 1B, FIG. 2, and FIG. 3. Note that in a circuit diagram, "OS" is written beside a transistor in order to indicate that the transistor includes an oxide semiconductor material.

<Basic Circuit>

First, a basic circuit configuration and circuit operation will be described with reference to FIGS. 1A and 1B. FIG. 1A is a circuit diagram illustrating the basic circuit configuration of a memory cell of a semiconductor device. In the circuit diagram in FIG. 1A, a first wiring (1st Line) is electrically connected to one of a source electrode and a drain electrode (e.g., the drain electrode) of a transistor 160. A second wiring (2nd Line) is electrically connected to the other of the source electrode and the drain electrode (e.g., the source electrode) of the transistor 160. A third wiring (3rd Line) is electrically connected to one of a source electrode and a drain electrode (e.g., the drain electrode) of a transistor 162. A fourth wiring (4th Line) is electrically connected to a gate electrode of the transistor 162. A gate electrode of the transistor 160 and the other of the source electrode and the drain electrode (e.g., the source electrode) of the transistor 162 are electrically connected to one of electrodes of a capacitor 164. A fifth wiring (5th Line) is electrically connected to the other of the electrodes of the capacitor 164.

Here, as the transistor 162, a transistor including an oxide semiconductor material (a transistor in which a channel is formed in an oxide semiconductor layer) can be used, for example. A transistor including an oxide semiconductor material has a characteristic of extremely small off-state current. For that reason, the potential of the gate electrode of the transistor 160 can be held for an extremely long time by turning off the transistor 162.

Note that the transistor 160 may be a transistor including any material and the transistor is not particularly limited thereto. In terms of improving speed for reading data, for example, a transistor with high switching speed, such as a transistor including single crystal silicon (e.g., a transistor in which a channel is formed in a single crystal silicon substrate or a single crystal silicon layer), is preferably used as the transistor 160.

The semiconductor device illustrated in FIG. 1A utilizes a characteristic in which the potential of the gate electrode of the transistor 160 can be stored for an extremely long time; therefore, data can be written and read as follows.

Writing of data will be described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is to say, predetermined charge is supplied to the gate electrode of the transistor 160. Here, any one of two charges corresponding to two different potentials (hereinafter, charge for supplying a low potential is referred to as charge $Q_L$, and charge for supplying a high potential is referred to as charge $Q_H$) is selectively supplied to the gate electrode of the transistor 160. Here, one of $Q_L$ and $Q_H$ is set as data "1" and the other is set as data "0", so that data of one bit can be written to a memory cell. Note that the memory capacity of the semiconductor device may be improved in such a manner that multi level data (data of a plurality of bits) is written to one memory cell by selecting charge to be supplied to the gate electrode of the transistor 160 among charges corresponding to three or more different potentials. After that, the potential of the fourth wiring is set to a potential at which the transistor 162 is turned off, so that the transistor 162 is turned off. Thus, the charge supplied to the gate electrode of the transistor 160 is held.

Since the off-state current of the transistor 162 is significantly small, the charge of the gate electrode of the transistor 160 is held for a long time.

Next, reading of data will be described. When an appropriate potential (a reading potential) is supplied to the fifth wiring, supplying a predetermined potential (a constant potential) to the second wiring, the resistance of the transistor 160 varies depending on the amount of charge held in the gate electrode of the transistor 160. This is because in general, when the transistor 160 is an n-channel transistor, an apparent threshold voltage $V_{th\_H}$ of the transistor 160 in the case where $Q_H$ is given to the gate electrode of the transistor 160 is lower than an apparent threshold voltage $V_{th\_L}$ of the transistor 160 in the case where $Q_L$ is supplied to the gate electrode of the transistor 160. Here, an apparent threshold value refers to the potential of the fifth wiring, which is needed to turn on the transistor 160. Thus, the potential of the fifth wiring is set to a potential V0 intermediate between $V_{th\_H}$ and $V_{th\_L}$, whereby charge supplied to the gate electrode of the transistor 160 in writing data can be determined. For example, in the case where $Q_H$ is supplied to the gate electrode of the transistor 160 in writing of data, when the potential of the fifth wiring is set to V0 (>$V_{th\_H}$), the transistor 160 is turned on. On the other hand, in the case where $Q_L$ is supplied to the gate electrode of the transistor 160 in writing of data, even when the potential of the fifth wiring is set to V0 (<$V_{th\_L}$), the transistor 160 remains off. Therefore, the stored data can be read by detecting the resistance of the transistor 160.

Note that in the case where a plurality of memory cells is arrayed to be used, only data of desired memory cells is needed to be read.

For example, in the case of a structure (a NAND type) in which the transistors 160 of the plurality of memory cells are electrically connected in series, the following operation is performed when data of a predetermined memory cell is read and data of the other memory cells is not read. A potential at which the transistor 160 is turned on, that is, a potential higher than $V_{th\_L}$ is supplied to the fifth wirings of the memory cells whose data is not to be read, regardless of the amount of charge supplied to the gate electrode in writing of data.

Further, for example, in the case of a structure (a NOR type) in which the transistors 160 of the plurality of memory cells are not electrically connected in series but each electrically connected to a wiring, the following operation is performed when data of a predetermined memory cell is read and data of the other memory cells is not read. A potential at which the transistor 160 is turned off, that is, a potential lower than $V_{th\_H}$ is supplied to the fifth wiring of the memory cell whose data is not to be read, regardless of the amount of charge supplied to the gate electrode in writing of data.

Then, rewriting of data will be described. Rewriting of data is performed in a manner similar to that of the writing and holding of data. In other words, the potential of the fourth wiring is set to a potential at which the transistor 162 is turned on, so that the transistor 162 is turned on. Accordingly, the potential of the third wiring (a potential corresponding to new data) is supplied to the gate electrode of the transistor 160 and the capacitor 164. After that, the potential of the fourth wiring is set to a potential at which the transistor 162 is turned off, so that the transistor 162 is turned off. Accordingly, charge corresponding to new data is held at the gate electrode of the transistor 160.

As described above, in a semiconductor device according to an embodiment of the invention disclosed herein, it is not necessary to erase written data before writing new data and it is possible to directly rewrite data by another writing of data. Accordingly, reduction in operation speed due to erasing of data can be suppressed. In other words, high-speed operation of the semiconductor device can be realized.

Note that the gate electrode of the transistor 160 is electrically connected to the drain electrode (or the source electrode) of the transistor 162 and the capacitor 164 and therefore has a function similar to that of a floating gate of a floating-gate transistor used for a nonvolatile memory element. Hereinafter, a portion in which the gate electrode of the transistor 160 is electrically connected to the drain electrode (or the source electrode) of the transistor 162 and the capacitor 164 is sometimes referred to as a node FG. In the case where the transistor 162 is off, the node FG can be regarded as a floating gate embedded in an insulator and charge is held in the node FG. The off-state current of the transistor 162 including an oxide semiconductor material is smaller than or equal to one hundred thousandth of the off-state current of a transistor in which a channel is formed in a silicon semiconductor; thus, loss of the charge accumulated in the node FG due to leakage current of the transistor 162 is negligible. That is to say, with the transistor 162 including an oxide semiconductor material, a nonvolatile memory device which can hold data without being supplied with power can be realized.

For example, when the off-state current of the transistor 162 is 10 zA (1 zA (zeptoampere) is $1 \times 10^{-21}$ A) or smaller at room temperature (25° C.) and the capacitance value of the capacitor 164 is approximately 10 fF, data can be held for $10^4$ seconds or longer. Needless to say, the holding time depends on transistor characteristics and capacitance of the capacitor.

Further, the semiconductor device according to an embodiment of the invention disclosed herein does not have the problem of deterioration of a gate insulating layer (a tunnel insulating layer), which has been a problem of a conventional floating-gate transistor. That is to say, the deterioration of a gate insulating layer due to injection of an electron into a floating gate, which has been traditionally regarded as a problem, can be solved. This means that there is no limit on the number of times of writing in principle. Furthermore, a high voltage needed for a conventional floating-gate transistor in writing or erasing data is not necessary.

Figure 1B:
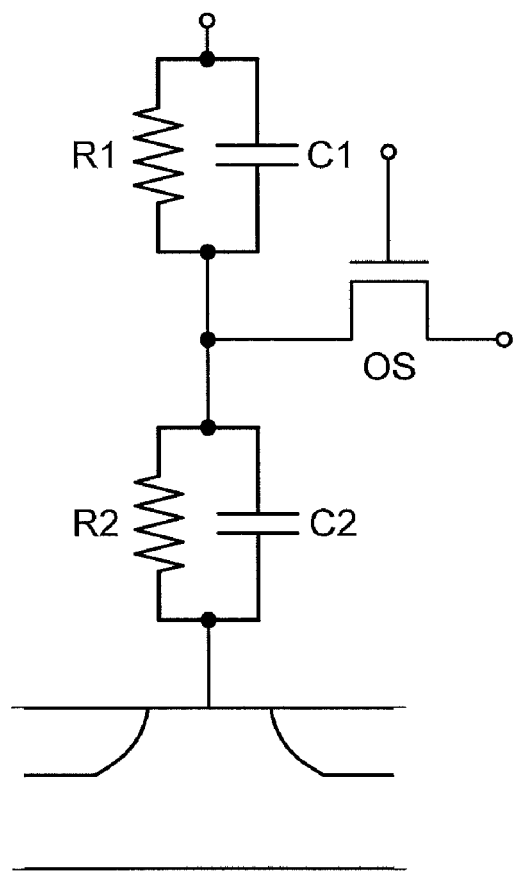

The components such as the transistors in the semiconductor device in FIG. 1A can be regarded as including a resistor and a capacitor as illustrated in FIG. 1B. In other words, in FIG. 1B, the transistor 160 and the capacitor 164 are each regarded as including a resistor and a capacitor. R1 and C1 denote the resistance value and the capacitance value of the capacitor 164, respectively. The resistance value R1 corresponds to the resistance value of an insulating layer included in the capacitor 164. In addition, R2 and C2 denote the resistance value and the capacitance value of the transistor 160, respectively. The resistance value R2 corresponds to the resistance value of a gate insulating layer at the time when the transistor 160 is on. The capacitance value C2 corresponds to the capacitance value of so-called gate capacitance (capacitance formed between a gate electrode and each of the source electrode and the drain electrode and capacitance formed between the gate electrode and a channel formation region).

The resistance value (also referred to as effective resistance) between the source electrode and the drain electrode when the transistor 162 is off is denoted by ROS. When R1 and R2 satisfy R1≧ROS and R2≧ROS under the condition that gate leakage current (leakage current between the gate electrode and the source electrode or between the gate electrode and the drain electrode) of the transistor 162 is sufficiently small, a period for holding charge accumulated in the node FG (also referred to as a data holding period) is determined mainly by the off-state current of the transistor 162.

On the other hand, when the condition is not satisfied, it is difficult to ensure an enough data holding period even if the off-state current of the transistor 162 is sufficiently small. This is because leakage current other than the off-state current of the transistor 162 (e.g., leakage current generated between the gate electrode and the source electrode of the transistor 162) is large. Thus, it can be said that the semiconductor device disclosed in this embodiment desirably satisfies R1≧ROS and R2≧ROS.

Meanwhile, it is desirable that C1 and C2 satisfy a relation of C1≧C2. This is because when C1 is large, the potential of the fifth wiring can be supplied to the node FG efficiently at the time of controlling the potential of the node FG by the fifth wiring, and a difference between potentials (e.g., a potential for selecting reading of data and a potential for not selecting reading of data) supplied to the fifth wiring can be reduced.

As described above, when the above relations are satisfied, a more preferable semiconductor device can be realized. Note that R1 and R2 are controlled by the insulating layer of the capacitor 164 and the gate insulating layer of the transistor 160. C1 and C2 are similarly controlled by the insulating layer of the capacitor 164 and the gate insulating layer of the transistor 160. Therefore, the material, the thickness, and the like of the gate insulating layer and the insulating layer of the capacitor 164 are desirably set as appropriate to satisfy the above relations.

In the semiconductor device described in this embodiment, the node FG has an effect similar to that of a floating gate of a floating-gate transistor of a flash memory or the like, but the node FG of this embodiment has a feature which is essentially different from that of the floating gate of the flash memory or the like.

In the case of a flash memory, since a potential applied to a control gate is high, it is necessary to keep a proper distance between memory cells in order to prevent a potential of the high voltage from affecting a floating gate of the adjacent memory cell. This is one of inhibiting factors for high integration of the semiconductor device. The factor is attributed to a basic principle of a flash memory, in which a tunneling current flows by applying a high electrical field.

On the other hand, the semiconductor device of this embodiment operates by switching of a transistor including an oxide semiconductor material and does not use the above-described principle of charge injection to a floating gate by a tunneling current. That is to say, a high electrical field for charge injection to a floating gate is not necessary unlike a flash memory. Accordingly, it is not necessary to consider an influence of a high electric field from a control gate on the adjacent memory cell, which facilitates high integration.

In addition, the semiconductor device according to an embodiment of the invention disclosed herein has advantages over a flash memory in that a large peripheral circuit (such as a booster circuit) for a high electric field is unnecessary because of no need of a high electric field. For example, the highest voltage applied to the memory cell according to this embodiment (the difference between the highest potential and the lowest potential which are applied to terminals of the memory cell at the same time) can be lower than or equal to 5 V, preferably lower than or equal to 3 V, in each memory cell in the case where data of two levels (one bit) is written.

Further, in the case where the dielectric constant ∈r1 of the insulating layer included in the capacitor 164 is different from the dielectric constant ∈r2 of the insulating layer included in the transistor 160, C1 can easily be made greater than or equal to C2 while S1 which is the area of the insulating layer included in the capacitor 164 and S2 which is the area of an insulating layer forming gate capacitance of the transistor 160 satisfy the relation where 2×S2 is greater than or equal to S1 (preferably, while S2 is greater than or equal to S1). In other words, C1 can easily be made greater than or equal to C2 while the area of the insulating layer included in the capacitor 164 is reduced. Specifically, for example, when a film formed of a high-k material such as hafnium oxide or a stack of a film formed of a high-k material such as hafnium oxide and a film formed of an oxide semiconductor is used for the insulating layer included in the capacitor 164, ∈r1 can be set to 10 or more, preferably 15 or more, and when silicon oxide is used for the insulating layer forming the gate capacitance, ∈r2 can be set to 3 to 4. A combination of such structures enables further higher integration of a semiconductor device according to an embodiment of the invention disclosed herein.

Application Example

Next, a more specific circuit configuration to which the circuit illustrated in FIGS. 1A and 1B is applied and its operation will be described with reference to FIG. 2 and FIG. 3.

Figure 2:
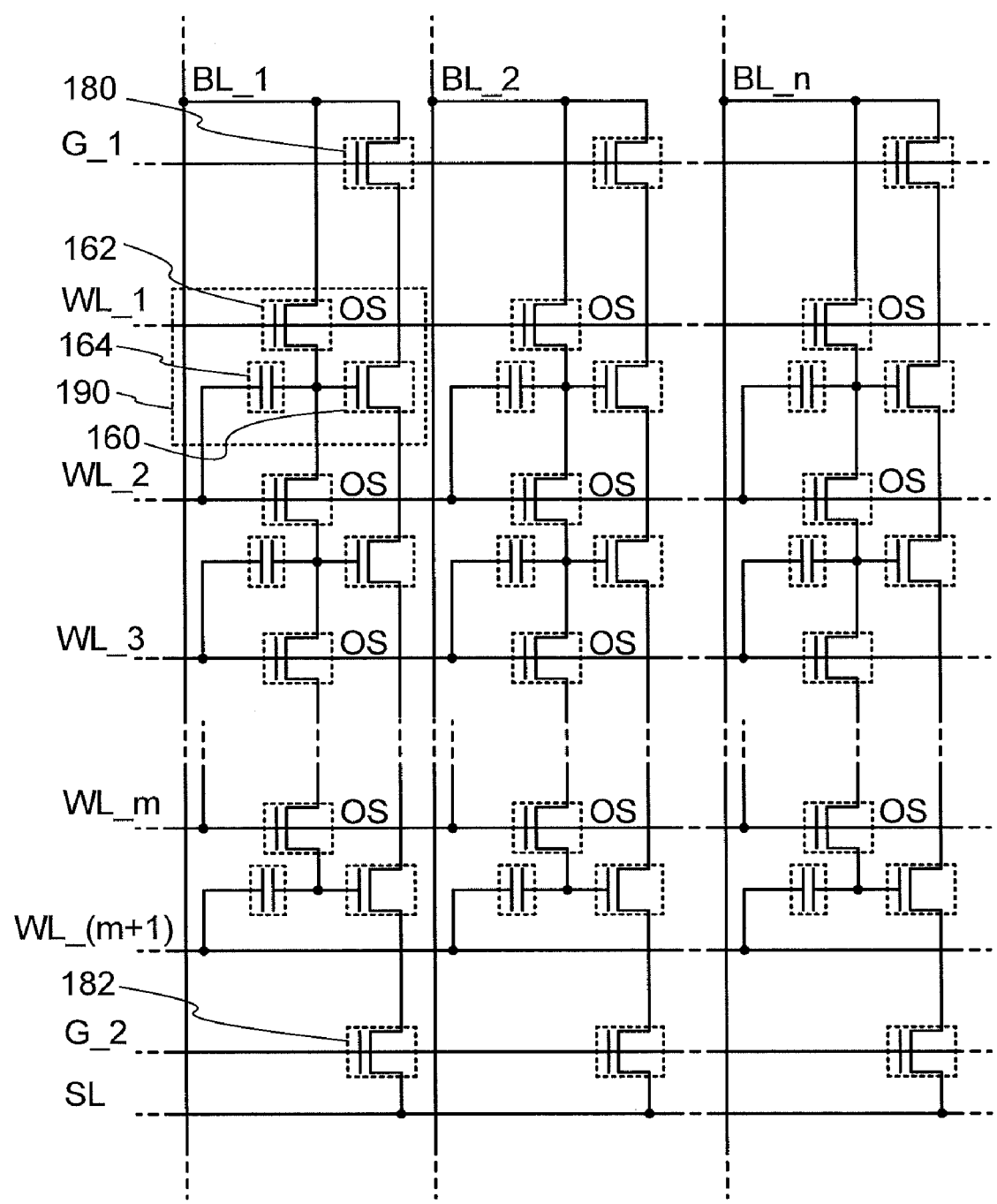
FIG. 2 is a circuit diagram of a semiconductor device.
Figure 3:
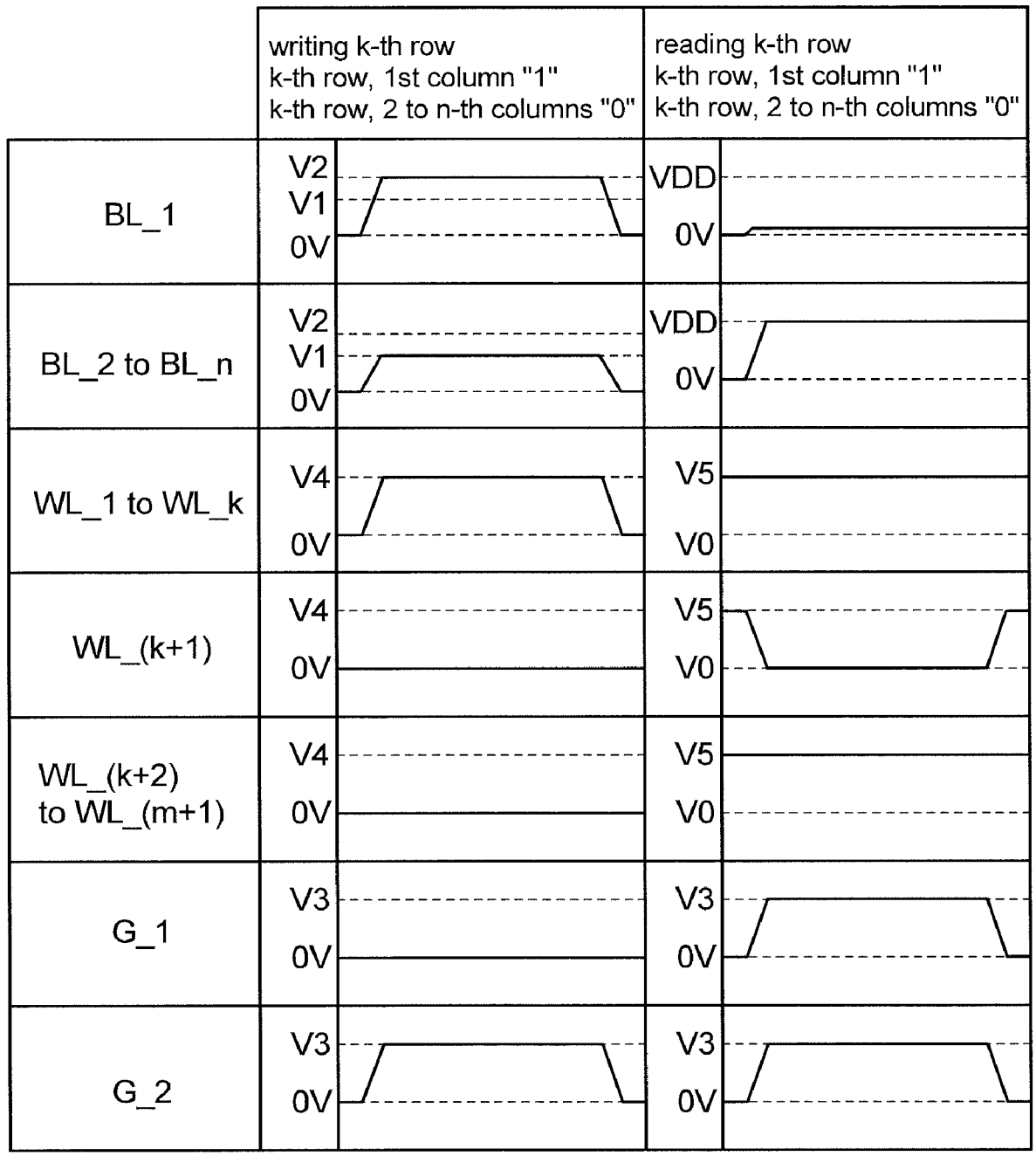
FIG. 3 is a timing diagram.

FIG. 2 illustrates an example of a circuit diagram of a NAND-type semiconductor device including m rows (in a vertical direction)×n columns (in a horizontal direction) memory cells 190 (m is a natural number greater than or equal to 2 and n is a natural number). Note that actually, the semiconductor device can include a plurality of sets of m (rows) (in a vertical direction)×n (columns) (in a horizontal direction) cells. In FIG. 2, lines having a similar function are distinguished by "_1", "_2", and the like added to the end of their names.

The semiconductor device in FIG. 2 includes (m+1) word lines WL (WL_1 to WL_(m+1)), n bit lines BL (BL_1 to BL_n), a memory cell array in which the m rows (in a vertical direction)×n columns (in a horizontal direction) memory cells 190 are arranged in matrix, a source line SL, a selection line G_1, a selection line G_2, n selection transistors 180, and n selection transistors 182.

The n selection transistors 180 are arranged between the bit lines BL and the memory cells 190 in the first row along the selection line G_1. Gate electrodes of the n selection transistors 180 are electrically connected to the selection line G_1. The n selection transistors 182 are arranged between the memory cells 190 in the m-th row and the source line SL along the selection line G_2. Gate electrodes of the n selection transistors 182 are electrically connected to the selection line G_2.

The bit lines BL are electrically connected to the drain electrodes of the transistors 162 of memory cells in the first row and are electrically connected to the drain electrodes of the transistors 160 of the memory cells in the first row through the selection transistors 180. The source line SL is electrically connected to the source electrodes of the transistors 160 in the memory cells in the m-th row through the selection transistors 182.

The word line WL_k in the k-th row (k is a natural number greater than or equal to 1 and less than or equal to m) is electrically connected to the gate electrodes of the transistors 162 in the memory cells in the k-th row. The word line WL_(k+1) in the (k+1)-th row is electrically connected to one electrode of each of the capacitors 164 in the memory cells 190 in the k-th row.

The drain electrodes of the transistors 160 in the memory cells in the j-th row (j is a natural number greater than or equal to 2 and less than or equal to m) are electrically connected to the source electrodes of the transistors 160 in the memory cells 190 in the (j−1)-th row.

The drain electrode of the transistor 162 in the memory cell in the j-th row is electrically connected to the gate electrode of the transistor 160, the source electrode of the transistor 162, and the other electrode of the capacitor 164 in the memory cell in the (j−1)-th row. In the memory cell in the m-th row, the gate electrode of the transistor 160, the source electrode of the transistor 162, and the other electrode of the capacitor 164 are electrically connected to one another.

The structure of the memory cell 190 in FIG. 2 is similar to that in FIG. 1A. Specifically, in the memory cell 190 in the k-th row and q-th column (q is a natural number greater than and equal to 1 or less than or equal to n), for example, both the first wiring and the third wiring in FIG. 1A are electrically connected to the bit line BL_q in FIG. 2. In addition, the second wiring in FIG. 1A is electrically connected to the source line SL in FIG. 2. Further, the fourth wiring in FIG. 1A is electrically connected to the word line WL_k in FIG. 2. Furthermore, the fifth wiring in FIG. 1A is electrically connected to the word line WL_(k+1) in FIG. 2.

Note that in FIG. 2, only the memory cells in the first row are electrically connected to the bit lines BL not through the other memory cells and only the memory cells in the m-th row are electrically connected to the source line SL not through the other memory cells because the transistors 162 of the memory cells 190 are electrically connected in series in the column direction and the transistors 160 of the memory cells 190 are electrically connected in series in the column direction. The memory cells in the other rows are electrically connected to the bit lines BL and the source line SL through the other memory cells in the same column.

Here, in the semiconductor device illustrated in FIG. 2, the node FG of the memory cell in the (j−1)-th row has the structure in FIG. 1A, and in addition, is electrically connected to the drain electrode of the transistor 162 in the memory cell 190 in the j-th row. Here, the transistor 162 including an oxide semiconductor material in each of the memory cells in the j-th row and each of the memory cells in the (j−1)-th row has significantly small off-state current. Thus, in the memory cell 190 in the semiconductor device illustrated in FIG. 2, the potential of the node FG can be held for a long time by turning off the transistor 162 as in the semiconductor device illustrated in FIG. 1A.

As in a structure shown in FIG. 2, the transistors 162 in the memory cells 190 are electrically connected in series; thus, the source electrode of the transistor 162 in the memory cell 190 and the drain electrode of the transistor 162 in the memory cell 190 can be in contact with each other or one electrode can function as both the source electrode of the transistor 162 in the memory cell 190 and the drain electrode of the transistor 162 in the memory cell 190. Accordingly, only one of the source electrode and the drain electrode of the transistor 162 is included in each memory cell 190.

On the other hand, in the case where the transistors 162 in the memory cells 190 are not connected in series and the source electrode and the drain electrode are provided for each of the transistors 162 in the memory cells 190, one of the source electrode and the drain electrode of the transistor 162 needs to be connected to a wiring such as the bit line BL through an opening. That is to say, both of the source electrode and the drain electrode of the transistor 162 and the opening for connection with the wiring are included in each memory cell 190.

Therefore, as illustrated in FIG. 2, the transistors 162 in the memory cells 190 are electrically connected in series, whereby the area occupied by the memory cell 190 can be reduced. For example, when F is used to express the minimum feature size, the area occupied by the memory cell 190 can be $6F^2$ to $12F^2$. Accordingly, the degree of integration of the semiconductor device can be increased, and the storage capacity per unit area can be increased.

Moreover, as shown in FIG. 2, the word line WL_k is electrically connected to the gate electrode of the transistor 162 of the memory cell in the k-th row and the word line WL_(k+1) is electrically connected to one of electrodes of the capacitor 164 in the memory cell in the k-th row. Therefore, one wiring, that is, the same wiring (the word line WL_j) functions as both a wiring which is electrically connected to the one of the electrodes of the capacitor 164 of the memory cell in the (j−1)-th row and a wiring which is electrically connected the second gate electrode of the transistor 162 of the memory cell in the j-th row. Accordingly, the number of wirings per memory cell and the area occupied by one memory cell can be further reduced. In such a manner, the degree of integration of the semiconductor device can be increased, and the storage capacity per unit area can be increased.

Note that the selection line G_1, the selection line G_2, the selection transistors 180, and the selection transistors 182 are not necessarily provided. The selection line G_1 and the selection transistors 180 may be omitted. Alternatively, the selection line G_2 and the transistors 182 may be omitted.

In the configuration in FIG. 2, writing of data and reading of data are basically the same as those in FIGS. 1A and 1B. Note that data writing is performed at least for each row, and is performed sequentially for rows. The reason is that the node FG of the memory cell in the j-th row is connected to the node FG of the memory cell in the adjacent (j−1)-th row through the transistor 162 of the memory cell in the j-th row. In the configuration in FIG. 2, the operation of writing, storing, reading data will be described with reference to a timing diagram in FIG. 3. The names such as WL and BL in the timing diagram denote wirings to which potentials in the timing diagram are applied. The timing diagram in FIG. 3 illustrates the case where data "1" is written to the memory cell in the k-th row and the first column and data "0" is written to the memory cells in the k-th row and the second to the n-th columns, and the case where data "1" is read from the memory cell in the k-th row and the first column and data "0" is read from the memory cells in the k-th row and the second to the n-th columns.

The following case will be described: in the case where either a potential V1 or a potential V2 (V1<V2) is applied to the node FG, data stored when the potential V2 is applied to the node FG is data "1" and data stored when the potential V1 is applied to the node FG is data "0".

As an example, the case where data is written to the memory cell in the k-th row will be described. First, the potential of the selection line G_1 is set at a reference potential GND (0 V), for example, and the potential of the selection line G_2 is set at V3 (e.g., a power supply potential VDD). Accordingly, the selection transistor 182 is turned on and the selection transistor 180 is turned off. Note that, at least in writing of data, a predetermined potential (e.g., the reference potential GND (0 V)) is supplied to the source line SL.

The potential of the word line WL_k electrically connected to the gate electrode of the transistor 162 of the memory cell 190 (the memory cell in the k-th row) to which data is written is set at V4. The potential V4 is set to satisfy (V2+Vth(162)) <V4 when the threshold voltage of the transistor 162 is Vth (162). Accordingly, the transistor 162 of the memory cell in the k-th row is turned on and V2 or V1 is applied to the node FG of the memory cell in the k-th row. V1 is supplied to the bit line BL in the case of writing data "0" to the memory cell in the k-th row, and V2 is supplied to the bit line BL in the case of writing data "1" to the memory cell in the k-th row. In such a manner, as illustrated in "writing of data to the memory cells in the k-th row" of the timing diagram in FIG. 3, data "1" is written to the memory cell in the k-th row and the first column by supplying V2 to the bit line BL_1 for the first column, and data "0" is written to the memory cells in the k-th row and the second to the n-th columns by supplying V1 to the bit lines BL_2 to BL_n for the second to the n-th columns.

Note that in the case where other memory cells (the memory cells in the first to the (k−1)-th rows) are between the bit lines BL and the memory cells (the memory cells in the k-th row) to which data is written, the potentials of the word lines WL_1 to WL_(k−1) are set at V4 and the transistors 162 of the memory cells in the first to the (k−1)-th rows are turned on; thus, the potentials of the bit lines BL can be supplied to the drain electrodes of the transistors 162 of the memory cells (the memory cells in the k-th row) to which data is written.

Note that in the case where data is written to the memory cell in the k-th row, the potentials of the word lines WL_(k+1) to WL_(m+1) can be the reference potential GND (0 V), for example. Accordingly, for example, the potentials of the gate electrodes of the transistors 162 of the memory cells in the (k+1)-th to the m-th rows can be set at the reference potential GND (0 V). At the same time, for example, the potential of the ones of the electrodes (the electrodes which are not electrically connected to the nodes FG) of the capacitors 164 of the memory cells in the k-th to the m-th rows (in particular, the memory cell in the k-th row to which data is written) can be set at the reference potential GND (0 V). The potentials of the gate electrodes of the transistor 162 of the memory cells in the (k+1)-th to the m-th rows is set at 0 V, so that the transistor 162 can be turned off. This is because the potential V1 or the potential V2 is supplied to the drain electrode or the source electrode of the transistor 162. That is to say, when the threshold voltage of the transistor 162 is Vth(162), the potential V1 is determined to satisfy (Vth(162)+V1)>0. As a result, charge accumulated in the gate electrodes of the transistors 160 of the memory cells in the (k+1)-th to the m-th rows is held. Note that the potentials of the word lines WL_(k+1) to WL_(m+1) are not limited to 0 V and may be any potential as long as it is the potential at which the transistors 162 of the memory cells in the (k+1)-th to the m-th rows.

Further, the potential of the word line WL_k which is electrically connected to the memory cells 190 (the memory cell in the k-th row) to which data is written are set at GND (0 V), whereby writing of data is terminated. When the potential of the word line WL_k is set at GND (0 V), the transistors 162 of the memory cells in the k-th row is turned off and the charge accumulated in the node FG is held. When V2 corresponding to data "1" is supplied to the nodes FG, the potentials of the nodes FG are V2, and when V1 corresponding to data "0" is supplied to the nodes FG the potentials of the nodes FG are V1.

Since the off-state current of the transistor 162 is significantly small, the charge of the gate electrode of the transistor 160 is held for a long time.

Note that in the case where data is written to the memory cells in the k-th row, data needs to be written to the memory cells in the (k−1)-th row (the memory cells 190 provided closest to the bit lines BL) after the writing of data to the memory cells in the k-th row because the transistors 162 of the memory cells in the first to the k-th rows need to be turned on. In such a manner, writing and storing of data are performed sequentially from the memory cells in the m-th row to the memory cells in the first row.

Next, as an example, the case where data is read from the memory cells in the k-th row will be described. Note that in "reading of data from the memory cells in the k-th row" in the timing diagram in FIG. 3, the following case is illustrated as an example: data "1" is written to the memory cell in the k-th row and the first column and data "0" is written to the memory cells in the k-th row and the second to the n-th columns. The potential of the word line WL_(k+1) electrically connected to the capacitors 164 of the memory cells (the memory cells in the k-th row) from which data is read is set at V0. The potentials of the word lines WL_1 to WL_k and the word lines WL_(k+2) to WL_(m+1) which are electrically connected to the capacitors 164 of the memory cells in the first to the (k−1)-th rows and the (k+1) to the m-th rows from which data is not read are set at V5 (V5>V0). Further, the potentials of the selection line G_1 and the selection line G_2 are set at V3.

In the case where the potential of the word line WL_(k+1) electrically connected to the capacitors 164 of the memory cells (the memory cells in the k-th row) from which data is read is V0, the transistors 160 of the memory cells in the k-th row are turned on when the memory cells (the memory cells in the k-th row) from which data is read store data "1", that is, when the potential V2 is applied to the nodes FG in writing of data. On the other hand, the transistors 160 of the memory cells in the k-th row are turned off when the memory cells (the memory cells in the k-th row) from which data is read store data "0", that is, when the potential V1 is applied to the nodes FG in writing of data. In other words, the potential V0 is determined so as to satisfy Formula 1. Note that α expresses the coupling ratio (α=C1/(C1+C2)) and Vth(160) expresses the threshold voltage of the transistor 160. In other words, the potential V0 is determined to be an intermediate potential between $V_{th\_H}$ and $V_{th\_L}$ as explained in the above description of FIGS. 1A and 1B.

$$V1+V0\times\alpha < Vth(160) < V2+V0\times\alpha \qquad \text{[Formula 1]}$$

Furthermore, when the potentials of the word lines WL_1 to WL_k and WL_(k+2) to WL_(m+1) which are electrically connected to the capacitors 164 of the memory cells (the memory cells in the first to the (k−1)-th rows and the (k+1)-th to the m-th rows) from which data is not read are set at V5, whether data "1" is written to the memory cells from which data is read (the memory cells in the first to the (k−1)-th rows and the (k+1)-th to the m-th rows) or whether data "0" is written to them, the transistors 160 of the memory cells from which data is not read are turned on. That is to say, the potential V5 is determined so as to satisfy Formula 2.

$$Vth(160) < V1+V5\times\alpha \qquad \text{[Formula 2]}$$

Further, the potentials of the selection line G_1 and the selection line G_2 are set at V3, whereby the selection transistors 180 and the selection transistors 182 are turned on. Accordingly, the drain electrodes of the transistors 160 of the memory cells in the first row are electrically connected to the bit lines BL through the selection transistors 180 which are on, and the source electrodes of the transistors 160 of the memory cells in the m-th row are electrically connected to the source line SL through the selection transistors 182 which are on. Note that a predetermined potential (e.g., the reference potential GND (0 V)) is applied to the source line SL at least in reading of data.

Figure 4:
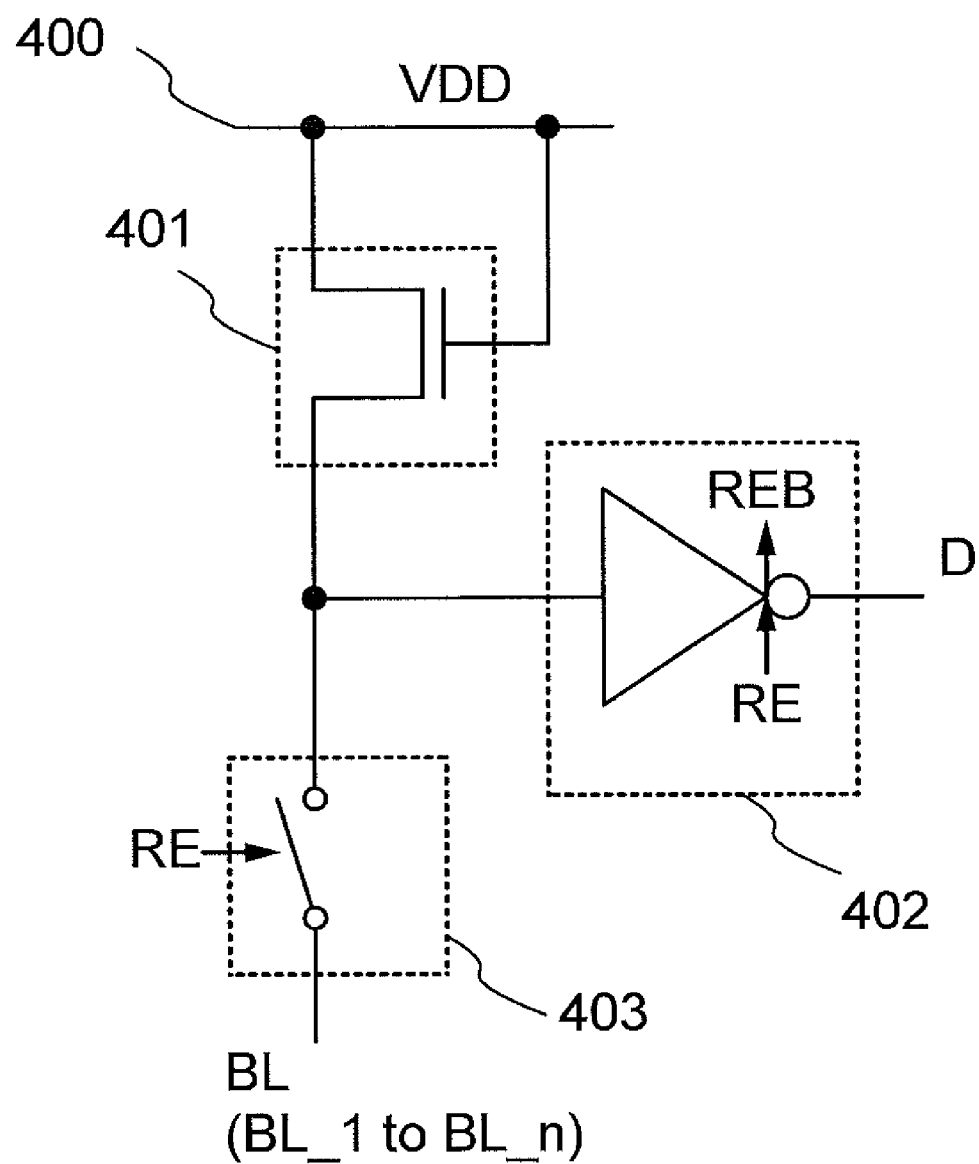
FIG. 4 is a circuit diagram of a semiconductor device.

The bit line BL is electrically connected to a reading circuit. FIG. 4 illustrates an example of a configuration of the reading circuit. In the reading circuit in FIG. 4, the bit line BL (corresponding to each of the bit lines BL_1 to BL_n) is electrically connected to a clocked inverter 402 and one of a source and a drain of a transistor 401 through a switch 403 controlled by a read enable signal (denoted by "RE" in FIG. 4). A gate of the transistor 401 and the other of the source and the drain of the transistor 401 are electrically connected to a wiring 400. The read enable signal (RE) and a signal (denoted by "REB" in FIG. 4) obtained by inversion of the read enable signal are input to the clocked inverter 402.

In the case where data "1" is written to the memory cell from which data is read (e.g., the memory cell in the k-th row and the q-th column), the transistor 160 of the memory cell is turned on in reading of data. Therefore, all of the transistors 160 of the memory cells in the q-th column which is electrically connected to the corresponding bit line BL_q, the selection transistor 180, and the selection transistor 182 are turned on. Thus, the memory cells between the bit line BL_q and the source line SL have a low resistance; therefore, the potential close to the potential (the reference potential GND (0 V)) applied to the source line SL, that is, a low potential is input to the clocked inverter 402, and an output (denoted by "D" in FIG. 4) of the reading circuit is a potential close to VDD.

On the other hand, in the case where data "0" is written to the memory cell from which data is read (e.g., the memory cell in the k-th row and the q-th column), the transistor 160 of the memory cell is turned off in reading of data. Accordingly, the memory cells between the bit line BL_q and the source line SL have a high resistance. The potential (the power supply potential VDD) applied to the wiring 400, that is, a high potential is input to the clocked inverter 402, and an output (D) of the reading circuit is 0 V.

As described above, the resistance between the bit line BL and the source line SL changes depending on data stored in a memory cell from which data is read, whereby data can be read.

Note that the configuration of the reading circuit is not limited to that in FIG. 4. A circuit with any configuration can be used as long as the circuit can detect a change of resistance between the bit line BL and the source line SL.

Note that the transistors 162 of all the memory cells (the memory cells in the first to the m-th rows) need to be off when data is read from the memory cells in the k-th row. That is because if the transistors 162 are turned on, the potentials of the nodes FG fluctuate and written data cannot be held.

Here, in the configuration in FIG. 2, one wiring functions as both a wiring electrically connected to the ones of the electrodes of the capacitors 164 of the memory cells in the (k−1)-th row and a wiring electrically connected to the gate electrodes of the transistor 162 of the memory cell in the k-th row. Here, considered are the threshold value (Vth(160)) of the transistor 160, the threshold value (Vth(162)) of the transistor 162, V0, V1, V2, V3, V4, V5, C1, and C2, with which the transistor 162 of all of the memory cells (the memory cells in the first to the m-th rows) are turned off in the above-described reading of data.

In order that the transistor 162 may be off in reading of data, the voltage between the source and the gate of the transistor 162 and the voltage between the drain and the gate of the transistor 162 need to be lower than or equal to Vth (162) in each memory cell. The potentials of the gate electrodes of the transistors 162 of the memory cells in the k-th row are the potential V5 and the lowest potentials of the source electrodes or the drain electrodes of the transistors 162 are (V1+V0×α); thus, Formula 3 needs to be satisfied in order to turn off the transistors 162 of the memory cells in the k-th row.

$$V5-V1-V0\times\alpha<Vth(162)\qquad\text{[Formula 3]}$$

In the case where the potential of the gate electrode of the transistor 162 of the memory cell in the (k+1)-th row is the potential V5, the lowest potential of the source electrode or the drain electrode of the transistor 162 is (V1+V5×α). In the case where the potentials of the gate electrodes of the transistors 162 of the memory cells in the (k+1)-th row are the potential V0, the lowest potentials of the source electrodes or the drain electrodes of the transistors 162 are (V1+V0×α). It is necessary to satisfy V5−V5×α−V1<Vth(162) and V0−V0× α−V1<Vth(162) in order to turn off the transistors 162 of the memory cells in the (k+1)-th row. Here, because V5>V0 is satisfied, the transistor 162 of the memory cells in the (k+1)-th row is automatically turned off when the formula (Formula 3) for turning off the transistors 162 of the memory cells in the k-th row is satisfied.

The potentials of the gate electrodes of the transistors 162 of the memory cells in the first to the (k−1)-th rows and the (k+2)-th to the m-th rows are the potential V5 and the lowest potentials of the source electrodes or the drain electrodes of the transistor 162 is (V1+V5×α). Accordingly, it is necessary to satisfy V5−V5×α−V1<Vth(162) in order to turn off the transistors 162 of the memory cells in the first to the (k−1)-th rows and the (k+2)-th to the m-th rows. Here, the transistors 162 of the memory cells in the first to the (k−1)-th rows and the (k+2)-th to the m-th rows are automatically turned off when the formula (Formula 3) for turning off the transistors 162 of the memory cells in the first to the (k−1)-th rows and the (k+2)-th to the m-th rows is satisfied.

Assuming that Vth(160) is 1 V, Vth(162) is 1 V, and the coupling ratio α (=C1/(C1+C2)) is 0.5, a combination example of potentials satisfying Formula 1 to Formula 3, V5>V0, and V2>V1, is as follows: V0=−2 V, V1=1.5 V, V2=2.5 V, V3=3 V, V4=3 V, and V5=0 V.

Reading of data at this time is examined A voltage of 0 V (V5) is input to the word lines WL_1 to WL_k and WL_(k+2) to WL_(m+1). The potentials of the nodes FG of the memory cells (the memory cells in the first to the (k−1)-th rows and the (k+1)-th to the m-th rows) from which data is not read are 1.5 V (=V1+V5×α) when data "0" is stored and 2.5 V (=V2+V5× α) when data "1" is stored. Because Vth(160) is 1 V, the transistors 160 of the memory cells (the memory cells in the first to the (k−1)-th rows and the (k+1)-th to the m-th rows) from which data is not read can be turned on. On the other hand, a potential of −2 V (V0) is input to the word line WL_(k+1)-th row. The potentials of the nodes FG of the memory cells (the memory cells in the k-th row) from which data is read is 0.5 V (=V1+V0×α) when data "0" is stored and 1.5 V (=V2+V0×α) when data "1" is stored. Here, because Vth(160) is 1 V, the transistor 160 can be turned off when data "0" is stored and the transistor 160 can be turned on when data "1" is stored. Further, because the potentials of the word lines WL_1 to WL_(m+1) are −2 V (V0) or 0 V (V5), the potentials (i.e., the potentials of the nodes FG) of the sources or the drains of the transistors 162 are 0.5 V, 1.5 V, or 2.5 V. Here, because Vth(162) is 1 V, the transistors 162 of all of the memory cells (the memory cells in the first to the m-th rows) can be turned off.

In such a manner, the transistors 162 of all of the memory cells (the memory cells in the first to the m-th rows) are turned off and data can be read from the memory cells in the k-th row by making the above-described setting.

Needless to say, the specific potentials of the threshold value of the transistor 160, the threshold value of the transistor 162, V0, V1, V2, V3, V4, and V5 are not limited to the above values and can be set at various values.

Further, here, the case where the transistor 160, the transistor 162, the selection transistor 180, and the selection transistor 182 are n-channel transistors will be described; however, this embodiment is not limited thereto. In the case of using another type of transistors, in writing and reading of data, each value of the potential may be determined so that on/off of the transistor included in the memory cell becomes similar to the above description.

In the configuration of FIG. 2, the transistors 162 included in the memory cells 190 are connected in series, so that it is difficult to rewrite only data in an arbitrary row. For this reason, as a driving method, it is preferable that data be written sequentially from the memory cells in the farthest row (the m-th row) from the bit line BL. Note that, by writing data "0" to the memory cells in the farthest row (the m-th row) from the bit line BL, data "0" is also written to the memory cells in the first to the (m−1)-th rows. With this method, data in a block including the memory cells in the first to the m-th rows can be erased at once.

A transistor in which a channel is formed in a layer including an oxide semiconductor layer has extremely small off-state current. Therefore, by using the transistor for each memory cell, charge flowing out from/to a capacitor in the case where the transistor is not selected can be reduced. As a result, a semiconductor device can hold stored data for an extremely long time. In other words, the semiconductor device needs no refresh operation or needs refresh operation at extremely low frequency. Thus, power consumption of the semiconductor device can be sufficiently reduced. Further, the semiconductor device can hold stored data for a long time even in the case where power is not supplied to the semiconductor device (note that it is preferable that a potential supplied to the semiconductor device is not varied between the case where power is supplied and the case where power is not supplied).

Further, in a semiconductor device in this embodiment, elements included in the semiconductor device hardly deteriorate because high voltage is not needed to write data to each memory cell. In the case of a conventional flash memory, as an example, there is a problem of deterioration of a gate insulating layer of a transistor because it is necessary that high voltage be applied to an element of a floating-gate transistor or the like included in a semiconductor device in order to inject or draw electrons to/from a floating gate. On the other hand, in a semiconductor device according to an embodiment of the invention disclosed herein, unlike a conventional flash memory, a gate insulating layer of a transistor hardly deteriorates because it is not necessary that high voltage be applied to an element of a floating-gate transistor or the like included in a semiconductor device. That is to say, a semiconductor device according to an embodiment of the invention disclosed herein has no limitation on the number of times of rewriting, which is a problem of a conventional non-volatile memory device, and reliability thereof is drastically improved. Further, in a semiconductor device in this embodiment, high-speed operation of a semiconductor device in this embodiment can be easily realized because data is written to each memory cell by controlling the on/off of a transistor included in the semiconductor device.

Further, a transistor including a material other than an oxide semiconductor (e.g., a transistor in which a channel is formed in a silicon substrate or a silicon layer) can operate at higher speed than a transistor including an oxide semiconductor material (a transistor in which a channel is formed in an oxide semiconductor layer). Therefore, the operation of the semiconductor device can be performed at high speed by using a combination of a transistor including a material other than an oxide semiconductor and a transistor including an oxide semiconductor material. Furthermore, a transistor including a material other than an oxide semiconductor can preferably realize circuits (e.g., a logic circuit and a driver circuit) in a semiconductor device, which are required to operate at high speed.

Thus, a semiconductor device having a novel feature can be realized by provision of both the transistor including a material other than an oxide semiconductor (and more broadly, a transistor capable of operation at sufficiently high speed) and the transistor including an oxide semiconductor material (and more broadly, a transistor whose off-state current is sufficiently small).

Further, in a semiconductor device in this embodiment, by series electrical connection of transistors including an oxide semiconductor material and included in memory cells of a semiconductor device, a source electrode of a transistor which includes an oxide semiconductor material and is included in a memory cell, and a drain electrode of an adjacent transistor which includes an oxide semiconductor material and is included in a memory cell, can be in contact with each other, or the source electrode of the transistor can function as the drain electrode of the adjacent transistor. Here, in the case where transistors including an oxide semiconductor material and included in memory cells are electrically connected in series, an opening needs to be provided in an interlayer insulating film or the like in order that one of a source and a drain of the transistor may be connected to a wiring provided in a layer which is not a layer provided with the one of the source electrode and the drain electrode. Therefore, the large area is needed for wiring connection in a memory cell. On the other hand, as in a semiconductor device according to an embodiment of the invention disclosed herein, transistors including an oxide semiconductor material and included in adjacent memory cells are electrically connected in series, so that a source electrode of a transistor which includes an oxide semiconductor material and is included in a memory cell, and a drain electrode of an adjacent transistor which includes an oxide semiconductor material and is included in a memory cell, can be in contact with each other, the source electrode of the transistor can function as the drain electrode of the adjacent transistor; therefore, the area occupied by one memory cell can be reduced. Accordingly, the degree of integration of the semiconductor device can be increased, and the storage capacity per unit area can be increased.

Moreover, a semiconductor device in this embodiment has a structure in which the k-th word line (k is a natural number greater than or equal to 1 and less than or equal to m) is electrically connected to the second gate terminal of the k-th memory cell and the (k+1)-th word line is electrically connected to one of terminals of the capacitor of the k-th memory cell. Therefore, one wiring, that is, the same wiring (the j-th word line) (j is a natural number greater than or equal to 2 and less than or equal to in) functions as both a wiring which is electrically connected to the one of the terminals of the capacitor of the (j−1)-th memory cell and a wiring which is electrically connected the second gate terminal of the j-th memory cell. Accordingly, the number of wirings per memory cell and the area occupied by one memory cell can be reduced. In such a manner, the degree of integration of the semiconductor device can be increased, and the storage capacity per unit area can be increased.

The methods and structures described in this embodiment can be combined as appropriate with any of the methods and structures described in the other embodiments.

Embodiment 2

In this embodiment, a structure according to an embodiment of the invention disclosed herein semiconductor device and a manufacturing method thereof will be described with reference to FIGS. 5A to 5C, FIGS. 6A to 6C, FIGS. 7A to 7E, FIGS. 8A to 8D, FIGS. 9A to 9D, and FIGS. 10A to 10D.

<Cross-sectional Structure and Planar Structure of Semiconductor Device>

Figure 5A:
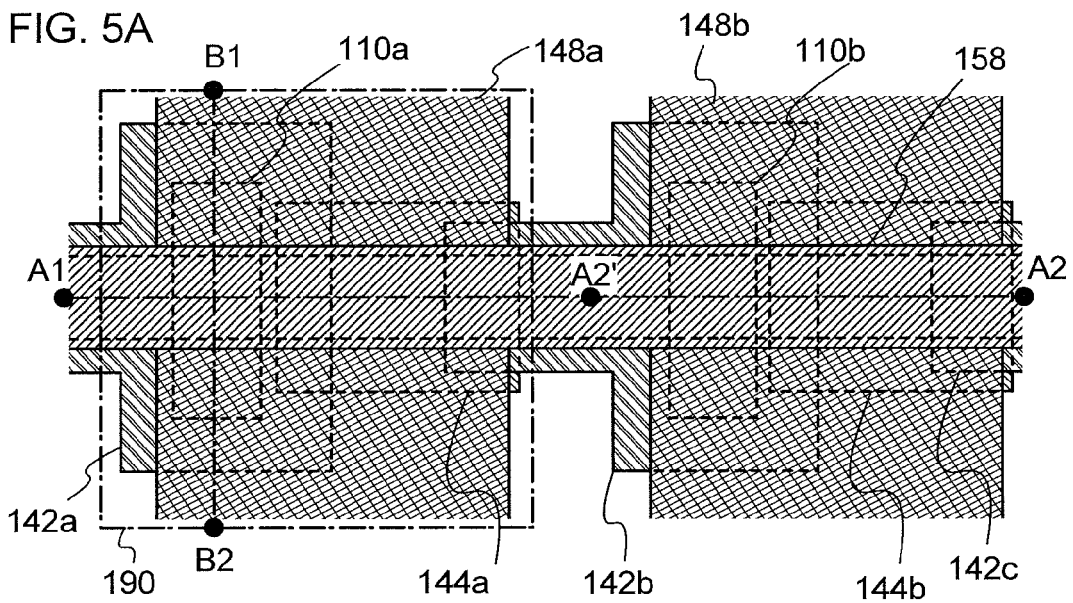
FIG. 5A is a plan view illustrating a structure of a semiconductor device and FIGS. 5B and 5C are cross-sectional views illustrating a structure of a semiconductor device.
Figure 5B:
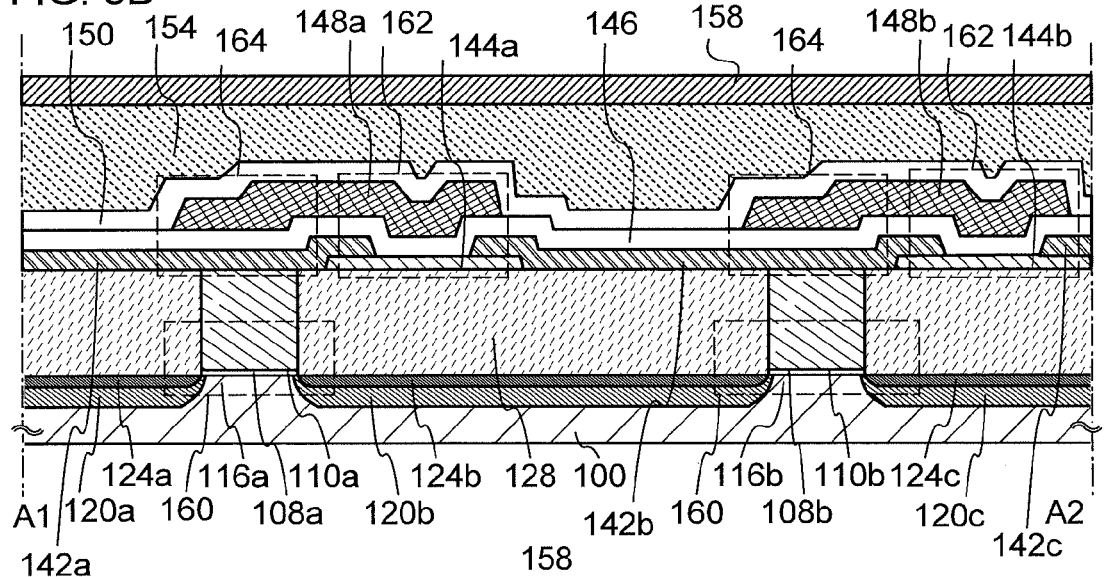
Figure 5C:
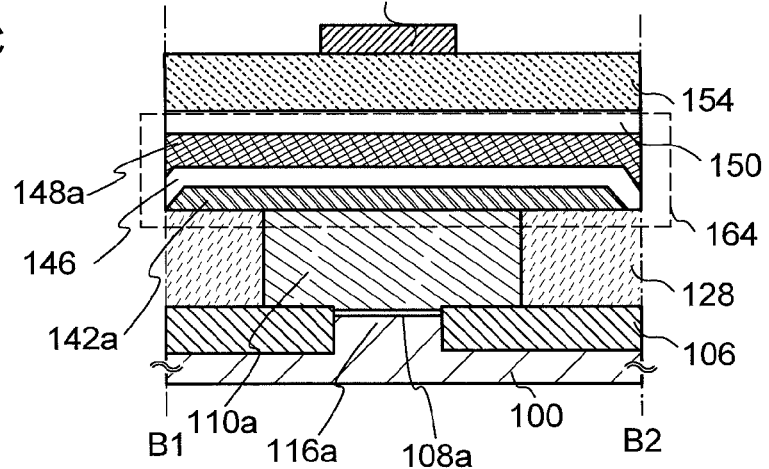

FIGS. 5A to 5C illustrate an example of a structure of the memory cell 190 of the semiconductor device illustrated in the circuit diagram of FIG. 2. FIG. 5A illustrates a plane of the semiconductor device and FIG. 5B and FIG. 5C illustrate cross-sections of the semiconductor device. Here, FIG. 5B illustrates a cross-section taken along line A1-A2 in FIG. 5A. FIG. 5B illustrates a cross-section taken along line B1-B2 in FIG. 5A. In FIG. 5A, a direction parallel to line A1-A2 corresponds to the column direction in the circuit diagram of FIG. 2, and a direction perpendicular to line A1-A2 corresponds to the row direction in the circuit diagram of FIG. 2.

In the semiconductor device illustrated in FIGS. 5A to 5C, a transistor 160 including a semiconductor material (e.g., silicon) other than an oxide semiconductor material is provided in a lower portion, and a transistor 162 including an oxide semiconductor and a capacitor 164 are provided in an upper portion. Note that FIGS. 5A and 5B illustrate a typical structure of the adjacent two memory cells 190 in FIG. 2. An example in which each memory cell includes one transistor 160, one transistor 162, and one capacitor 164 is illustrated. For description, the transistor 160 included in one of the illustrated memory cells is referred to as "the transistor 160 on the left" and the transistor 160 included in the other of the illustrated memory cells is referred to as "the transistor 160 on the right". For description, the transistor 162 included in one of the illustrated memory cells is referred to as "the transistor 162 on the left" and the transistor 162 included in the other of the illustrated memory cells is referred to as "the transistor 162 on the right". For description, the capacitor 164 included in one of the illustrated memory cells is referred to as "the capacitor 164 on the left" and the capacitor 164 included in the other of the illustrated memory cells is referred to as "the capacitor 164 on the right".

In practice, the number of the memory cells is not two. As shown in the circuit diagram of FIG. 2, the memory cells are provided in the first to the m-th rows. The transistors 160 of the memory cells in the same column are electrically connected in series. The transistors 162 of the memory cells in the same column are electrically connected in series. Note that FIGS. 5A to 5C do not illustrate the selection transistor 180 and the selection transistor 182, but the transistors can have the same structure of the transistor 160.

Needless to say, although the transistor 160 and the transistor 162 are n-channel transistors here, p-channel transistors can be used. The technical feature of the invention disclosed herein is that a semiconductor material with which off-state current can be sufficiently reduced, such as an oxide semiconductor, is used for the transistor 162 in order to hold data. Therefore, it is not necessary to limit specific conditions, such as a material, a structure, or the like of the semiconductor device, to those given here.

The transistor 160 on the left in FIGS. 5A and 5B includes a channel formation region 116a provided in a substrate 100 including a semiconductor material (such as silicon), an impurity region 120a and an impurity region 120b provided such that the channel formation region 116a is provided therebetween, a metal compound region 124a and a metal compound region 124b in contact with the impurity region 120a and the impurity region 120b, a gate insulating layer 108a provided over the channel formation region 116a, and a gate electrode 110a provided over the gate insulating layer 108a. The transistor 160 on the right includes a channel formation region 116b provided in the substrate 100 including a semiconductor material (e.g., silicon); the impurity region 120b and the impurity region 120c provided such that the channel formation region 116b is provided therebetween; the metal compound region 124b and the metal compound region 124c in contact with the impurity region 120b and the impurity region 120c; a gate insulating layer 108b provided over the channel formation region 116b; and a gate electrode 110b provided over the gate insulating layer 108b.

Note that a transistor whose source electrode and drain electrode are not illustrated in a drawing may be referred to as a transistor for the sake of convenience. Further, in such a case, in description of connection of a transistor, a source region and a source electrode are collectively referred to as a "source electrode," and a drain region and a drain electrode are collectively referred to as a "drain electrode". In other words, in this specification, the term "source electrode" may include a source region and the term "drain electrode" may include a drain region.

Note that in this specification, the impurity region 120a, the impurity region 120b, and an impurity region 120c are collectively referred to as impurity regions 120 in some cases. In this specification, the metal compound region 124a, the metal compound region 124b, and a metal compound region 124c are collectively referred to as metal compound regions 124 in some cases. In this specification, the channel formation region 116a and the channel formation region 116b are collectively referred to as channel formation regions 116 in some cases. In this specification, the gate insulating layer 108a and the gate insulating layer 108b are collectively referred to as gate insulating layers 108 in some cases. Furthermore, in this specification, the gate electrode 110a and the gate electrode 110b are collectively referred to as gate electrodes 110 in some cases.

Here, the transistors 160 in the first to m-th rows share the impurity regions 120 and the metal compound regions 124 functioning as source regions and drain regions, and are electrically connected in series. In FIG. 5B, the impurity region 120b and the metal compound region 124b function as one of a source region and a drain region of the transistor 162 on the left and the other of the source region and the drain region of the transistor 162 on the right. That is to say, the impurity region 120 and the metal compound region 124 which function as a source region of the transistor 160 in the (j−1)-th row (j is a natural number greater than or equal to 2 and less than or equal to in) function as a drain region of the transistor 160 in the j-th row. In this manner, the transistors 160 of the memory cells 190 are connected in series, whereby the source region and the drain region can be shared by the transistors 160 of the memory cells 190. In other words, in each of the memory cells 190, one of the source region and the drain region of the transistor 160 does not need to be connected to a wiring (e.g., a wiring 158) formed in another layer through an opening. Therefore, the planar layout of the transistor 160 can easily overlap the transistor 162; thus, the area occupied by the memory cell 190 can be reduced.

Further, as illustrated in FIG. 5C, an element isolation insulating layer 106 is provided over the substrate 100. In this manner, the source region, the channel formation region, and the drain region of the transistor 160 are isolated from the source region, the channel formation region, and the drain region of the adjacent transistor 160 included in the memory cell in the adjacent column and the same row.

An insulating layer 128 is provided over the transistor 160 so as to expose the top surface of the gate electrode 110. Note that in order to realize high integration, it is preferable that, as in FIGS. 5B and 5C, the transistor 160 does not have a sidewall insulating layer. On the other hand, when importance is put on the characteristics of the transistor 160, sidewall insulating layers may be provided on side surfaces of the gate electrode 110, and the impurity regions 120 may include a plurality of different regions in impurity concentration. The insulating layer 128 preferably has a surface with favorable planarity; for example, the surface of the insulating layer 128 preferably has a root-mean-square (RMS) roughness of 1 nm or less. In this manner, the channel formation region (an oxide semiconductor layer 144) of the transistor 162 is provided in an extremely flat region having a root-mean-square (RMS) roughness of 1 nm or less, whereby the transistor 162 which can prevent a defect such as a short-channel effect and has favorable characteristics can be provided even when the transistor 162 is miniaturized.

The transistor 162 on the left in FIGS. 5A and 5B includes an electrode 142a and an electrode 142b which are formed over the insulating layer 128; an oxide semiconductor layer 144a in contact with part of the electrode 142a and the electrode 142b; a gate insulating layer 146 covering the oxide semiconductor layer 144a; and a gate electrode 148a provided over the gate insulating layer 146 so as to overlap the oxide semiconductor layer 144a. The transistor 162 on the right in FIGS. 5A and 5B includes an electrode 142b and an electrode 142c which are formed over the insulating layer 128; an oxide semiconductor layer 144b in contact with part of the electrode 142b and the electrode 142c; a gate insulating layer 146 covering the oxide semiconductor layer 144b; and a gate electrode 148b provided over the gate insulating layer 146 so as to overlap the oxide semiconductor layer 144b.

Note that in this specification, the oxide semiconductor layer 144a and the oxide semiconductor layer 144b are collectively referred to as the oxide semiconductor layers 144 in some cases. In specification, the electrode 142a, the electrode 142b, and the electrode 142c are collectively referred to as the electrodes 142 in some cases. In the specification, the gate electrode 148a and the gate electrode 148b are collectively referred to as the gate electrodes 148 in some cases.

Here, the oxide semiconductor layer 144 is preferably a highly-purified oxide semiconductor layer by sufficiently removing impurities such as hydrogen or sufficiently supplying oxygen. Specifically, the hydrogen concentration of the oxide semiconductor layer 144 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration of the oxide semiconductor layer 144 is measured by secondary ion mass spectrometry (SIMS). Thus, in the oxide semiconductor layer 144 in which the hydrogen concentration is sufficiently reduced so that the oxide semiconductor layer is purified and defect levels in the energy gap due to oxygen deficiency are reduced by sufficient supply of oxygen, the density of carriers due to a donor such as hydrogen is lower than $1 \times 10^{12}$/cm$^3$, preferably lower than $1 \times 10^{11}$/cm$^3$, further preferably lower than $1.45 \times 10^{10}$/cm$^3$. In addition, for example, the off-state current (per unit channel width (1 μm), here) at room temperature (25° C.) is 100 zA (1 zA (zeptoampere) is $1 \times 10^{-21}$ A) or less or 10 zA or less. In this manner, by using an oxide semiconductor which is made to be an i-type (intrinsic) oxide semiconductor or a substantially i-type oxide semiconductor, the transistor 162 which has excellent off-state current characteristics can be obtained.

The transistors 162 in the first to m-th rows share the electrodes 142, and are electrically connected in series. In FIG. 5B, the electrode 142b is one of the source electrode and the drain electrode of the transistor 162 on the left and is the other of the source electrode and the drain electrode of the transistor 162 on the right. In other words, the electrode 142 functioning as the source electrode of the transistor 162 in the (j−1)-th row (j is a natural number greater than or equal to 2 and less than or equal to in) and the electrode 142 functioning as the drain electrode of the transistor 162 in the j-th row are formed of one conductive layer.

In this manner, the transistors 162 of the memory cells 190 are connected in series, whereby the electrodes 142 of the transistors 162 can be shared in the memory cells 190. Thus, only one of the source electrode and the drain electrode of the transistor 162 is included in the planar layout of the memory cell 190. Therefore, the length in the column direction in the planar layout of the memory cell 190 can be shorter.

Note that the gate electrode 148 also functions as the word line WL and one of the terminals (i.e., electrodes) of the capacitor 164 in the circuit diagram of FIG. 2.

The capacitor 164 on the left in FIGS. 5A to 5C includes the electrode 142a, the gate insulating layer 146, and the gate electrode 148a which are provided over the insulating layer 128. Specifically, the electrode 142a is the one of the electrodes of the capacitor 164 on the left, the gate electrode 148a is the other of the electrodes of the capacitor 164 on the left, and the gate insulating layer 146 is a dielectric layer of the capacitor 164 on the left. The capacitor 164 on the right in FIGS. 5A to 5C includes the electrode 142b, the gate insulating layer 146, and the gate electrode 148b which are provided over the insulating layer 128. Specifically, the electrode 142b is the one of the electrodes of the capacitor 164 on the right, the gate electrode 148b is the other of the electrodes of the capacitor 164 on the right, and the gate insulating layer 146 is a dielectric layer of the capacitor 164 on the right. The capacitor 164 can be provided to overlap the transistor 160 and is formed to share part of the structure of the transistor 162, whereby the area occupied by the memory cell 190 can be reduced.

Therefore, the structure illustrated in FIGS. 5A to 5C is employed for the planar layout of the memory cell 190, whereby the area occupied by the memory cells 190 can be reduced. For example, when F is used to express the minimum feature size, the area occupied by the memory cell 190 can be 4 F$^2$ to 12 F$^2$. Accordingly, the degree of integration of the semiconductor device can be increased, and the storage capacity per unit area can be increased.

An insulating layer 150 is formed over the transistor 162 and an insulating layer 154 is formed over the insulating layer 150. The wiring 158 is formed over the insulating layer 154. Here, the wiring 158 functions as the bit line BL in the circuit diagram of FIG. 2. Note that although not illustrated in FIGS. 5A to 5C, the wiring 158 is electrically connected to the source electrode or the drain electrode of the transistor 162 in the first row in an opening formed in the insulating layer 154, the insulating layer 150, the gate insulating layer 146, and the like.

With the above structure, the size of the planar layout of the memory cell 190 including the transistor 160, the transistor 162, and the capacitor 164 can be reduced. When such a planar layout is employed, the degree of integration of the circuit in FIG. 2 can be increased. For example, when F is used to express the minimum feature size, the area occupied by the memory cell can be expressed as 4 F$^2$ to 12 F$^2$. Accordingly, the storage capacity per unit area of the semiconductor device can be increased.

Figure 6A:
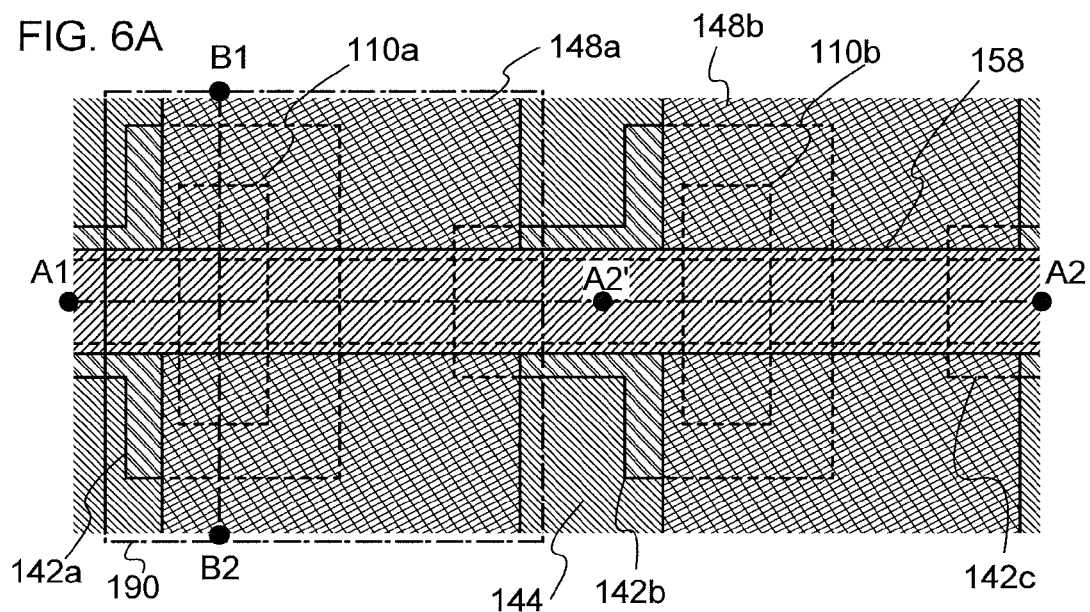
FIG. 6A is a plan view illustrating a structure of a semiconductor device and FIGS. 6B and 6C are cross-sectional views illustrating a structure of a semiconductor device.
Figure 6B:
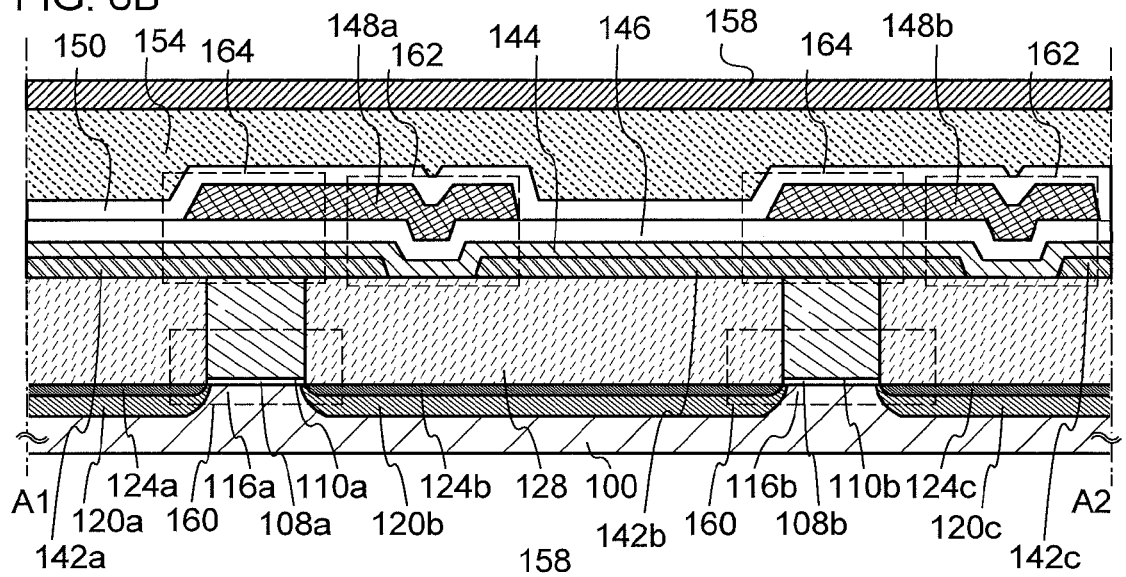
Figure 6C:
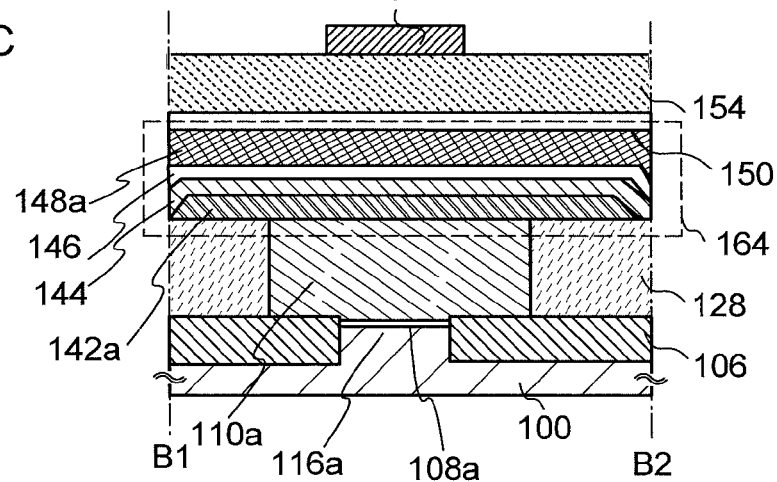

Note that the structure of a semiconductor device according to an embodiment of the invention disclosed herein is not limited to the structure illustrated in FIGS. 5A to 5C. In the structure in FIGS. 5A to 5C, the details such as a connection relationship of electrodes can be changed as appropriate. For example, the structure in FIGS. 5A to 5C shows an example in which the oxide semiconductor layer 144 is provided under the electrode 142. However, the structure is not limited thereto. The oxide semiconductor layer 144 may be provided over the electrode 142. FIGS. 6A to 6C illustrate an example in which the oxide semiconductor layer 144 is provided over the electrode 142. Note that in FIGS. 6A to 6C, portions identical to those in FIGS. 5A to 5C are denoted by the same reference numerals.

In the structure illustrated in FIGS. 6A to 6C, the end portions of the electrode 142a, the electrode 142b, and the electrode 142c are preferably tapered. When the end portions of the electrode 142a, the electrode 142b, and the electrode 142c are tapered, the coverage with the oxide semiconductor layer 144 can be improved and a breaking thereof can be prevented. Here, a taper angle is, for example, greater than or equal to 30° and less than or equal to 60°. Note that the taper angle refers to an inclination angle formed by a side surface and a bottom surface of a layer (e.g., the electrode 142a) having a tapered shape when the layer is observed from the direction perpendicular to the cross section of the layer (i.e., the plane perpendicular to the surface of the substrate).

The capacitor 164 on the left in FIGS. 6A to 6C includes the electrode 142a, the oxide semiconductor layer 144, the gate insulating layer 146, and the gate electrode 148a which are provided over the insulating layer 128. Specifically, the electrode 142a is the one of the electrodes of the capacitor 164 on the left, the gate electrode 148a is the other of the electrodes of the capacitor 164 on the left, and the oxide semiconductor layer 144 and the gate insulating layer 146 are a dielectric layer of the capacitor 164 on the left. The capacitor 164 on the right in FIGS. 6A to 6C includes the electrode 142b, the oxide semiconductor layer 144, the gate insulating layer 146, and the gate electrode 148b which are provided over the insulating layer 128. Specifically, the electrode 142b is one of the electrodes of the capacitor 164 on the right, the gate electrode 148b is the other of the electrodes of the capacitor 164 on the right, and the oxide semiconductor layer 144 and the gate insulating layer 146 are a dielectric layer of the capacitor 164 on the right. The structure illustrated in FIGS. 6A to 6C includes the oxide semiconductor layer 144 and the gate insulating layer 146 as the dielectric layer of the capacitor 164 while the structure illustrated in FIGS. 5A to 5C includes only the gate insulating layer 146 as the dielectric layer of the capacitor 164. In the structure illustrated in FIGS. 6A to 6C, the oxide semiconductor layer 144 can have a shape extended to the column direction, differing from the structure illustrated in FIGS. 5A to 5C. That is to say, the memory cells in the first to the m-th row can share the oxide semiconductor layer 144. Note that the oxide semiconductor layers 144 in adjacent columns are separated. Compared to the structure illustrated in FIGS. 5A to 5C, in the structure illustrated in FIGS. 6A to 6C, an insulator of the capacitor 164 can have a larger thickness; therefore, leakage current of the capacitor 164 can be reduced.

As an example, in FIGS. 5A to 5C and FIGS. 6A to 6C, the transistor 160 is formed over a semiconductor substrate. However, this embodiment of the invention disclosed herein is not limited thereto. The transistor 160 is formed over an SOI substrate. Note that the term "SOI substrate" generally means a substrate where a silicon semiconductor layer is provided over an insulating surface. In this specification and the like, the term "SOI substrate" also means a substrate where a semiconductor layer including a material other than silicon is provided over an insulating surface. That is to say, a semiconductor layer included in the "SOI substrate" is not limited to a silicon semiconductor layer. In addition, the transistor 160 may be formed using a semiconductor layer such as silicon faulted over a substrate with an insulating surface. The semiconductor layer may be formed by crystallization of a thin amorphous semiconductor layer which is provided over an insulating surface.

<Method for Manufacturing Semiconductor Device>

Next, an example of a method for manufacturing the semiconductor device will be described. First, a method for manufacturing the transistor 160 in the lower portion will be described below with reference to FIGS. 7A to 7E and FIGS. 8A to 8D; then, a method for manufacturing the transistor 162 in the upper portion and the capacitor 164 will be described with reference to FIGS. 9A to 9D and FIGS. 10A to 10D. Note that FIGS. 7A to 7E, FIGS. 8A to 8D, FIGS. 9A to 9D, and FIGS. 10A to 10D illustrate a cross-sections taken along lines A1-A2' and B1-B2 in FIG. 5A and FIG. 6A and an example of a method for manufacturing the structure. That is to say, the transistor 160 on the left, the transistor 162 on the left, and the capacitor 164 on the left are shown as a typical example, and an example of a method for manufacturing them will be described. Note that a method for manufacturing another transistor and the like (e.g., the transistor 160 on the right, the transistor 162 on the right, and the capacitor 164 on the right) can be similar to the method for manufacturing the transistor 160 on the left, the transistor 162 on the left, and the capacitor 164 on the left.

<Method for Manufacturing Transistor in Lower Portion>

First, the substrate 100 including a semiconductor material is prepared (see FIG. 7A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material will be described. In particular, a single crystal semiconductor substrate such as a single crystal silicon substrate is preferably used as the substrate 100 including a semiconductor material because the semiconductor device can operate at higher speed.

Note that an impurity element which imparts a conductivity type may be added to a region which later functions as the channel formation region 116a of the transistor 160, in order to control the threshold voltage of the transistor. Here, an impurity element imparting a conductivity type is added so that the threshold voltage of the transistor 160 is positive. Boron, aluminum, gallium, or the like can be used as the impurity imparting the conductivity type in the case where a semiconductor material is silicon. Note that it is preferable to perform heat treatment after adding an impurity element which imparts a conductivity type, in order to activate the impurity element or reduce defects which may be generated in the substrate 100 during addition of the impurity element.

A protective layer 102 serving as a mask for forming an element isolation insulating layer is formed over the substrate 100 (see FIG. 7A). As the protective layer 102, for example, an insulating layer formed using silicon oxide, silicon nitride, silicon oxynitride or the like can be used.

Next, part of the substrate 100 in a region (i.e., in an exposed region) which is not covered with the protective layer 102 is removed by etching of the substrate 100 using the protective layer 102 as a mask (see FIG. 7B). As the etching, dry etching is preferably performed, but wet etching can be performed. An etching gas and an etchant can be selected as appropriate depending on a material of layers to be etched.

Then, an insulating layer is formed so as to cover the substrate 100, and the insulating layer is selectively removed; thus, the element isolation insulating layer 106 is formed (see FIG. 7C). The insulating layer is formed using silicon oxide, silicon nitride, silicon oxynitride, or the like. As a method for removing the insulating layer, any of etching treatment, polishing treatment such as chemical mechanical polishing (CMP) treatment, and the like can be employed. Thus, a semiconductor region 104 isolated from the other semiconductor regions is formed. Note that the protective layer 102 is removed after the substrate 100 is etched using the protective layer 102 as a mask or after the element isolation insulating layer 106 is formed.

Next, an insulating layer is formed over a surface of the semiconductor region 104, and a layer including a conductive material is formed over the insulating layer.

The insulating layer is to be a gate insulating layer later and can be formed by performing heat treatment (e.g., thermal oxidation treatment or thermal nitridation treatment) on the surface of the semiconductor region 104, for example. Instead of heat treatment, high-density plasma treatment may be employed. The high-density plasma treatment can be performed using, for example, a mixed gas of a rare gas such as He, Ar, Kr, or Xe and a gas such as oxygen, nitrogen oxide, ammonia, nitrogen, or hydrogen. Needless to say, the insulating layer may be formed using CVD, sputtering, or the like. The insulating layer preferably has a single-layer structure or a stacked-layer structure of a film including silicon oxide, silicon oxynitride, silicon nitride, hafnium oxide, aluminum oxide, tantalum oxide, yttrium oxide, hafnium silicate (Hf-$Si_xO_y$ (x>0, y>0)), hafnium silicate to which nitrogen is added (Hf$Si_xO_yN_z$ (x>0, y>0, z>0)), hafnium aluminate to which nitrogen is added (Hf$Al_xO_yN_z$ (x>0, y>0, z>0)), or the like. The insulating layer can have a thickness of, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, CVD, sputtering, or a spin coating method can be employed. Note that in this embodiment, the case where the layer including a conductive material is formed using a metal material will be described.

After that, the insulating layer and the layer including a conductive material are selectively etched to form the gate insulating layer 108a and the gate electrode 110a (see FIG. 7D).

Phosphorus (P), arsenic (As), or the like is added to the semiconductor region 104 to form the channel formation region 116a, the impurity region 120a, and the impurity region 120b (see FIG. 7E). Note that the transistor 160 is an n-channel transistor here, and an impurity element which imparts a conductivity type, such as phosphorus or arsenic, is added to the semiconductor region 104 in order to form an n-channel transistor. On the other hand, in the case where the transistor 160 is a p-channel transistor, an impurity element which imparts a conductivity type, such as boron (B) or aluminum (Al), is added to the semiconductor region 104; thus, the channel formation region 116a, the impurity region 120a, and the impurity region 120b may be formed. Here, the concentration of added impurity elements which impart a conductivity type can be set as appropriate, but the concentration is preferably high in the case where the transistor 160 is drastically miniaturized.

Note that a side wall insulating layer is formed around the gate electrode 110a, and a plurality of impurity regions (e.g., a heavily-doped impurity region not overlapped with a side wall insulating layer and a lightly-doped impurity region overlapped with the side wall insulating layer) to which impurity elements which impart a conductivity type are added at a different concentration is formed in the semiconductor region 104.

Figure 8A:
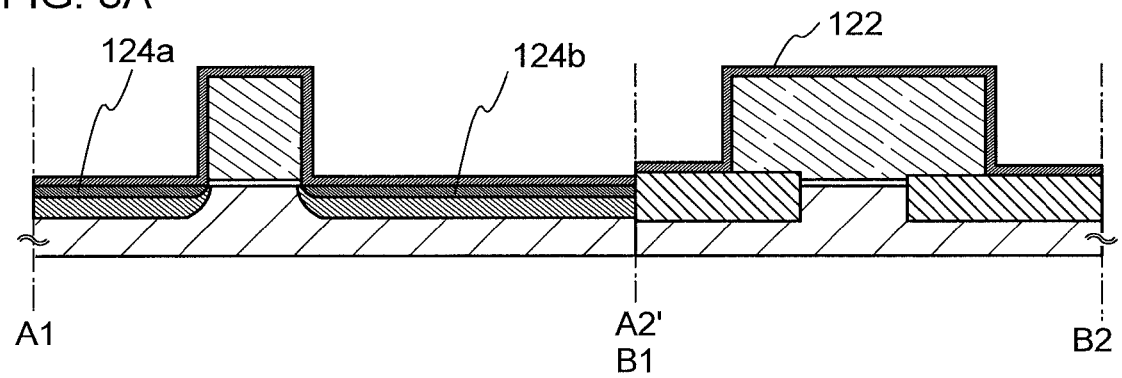
FIGS. 8A to 8D are diagrams illustrating a method for manufacturing a semiconductor device.

Then, a metal layer 122 is formed to cover the gate electrode 110a, the impurity region 120a, and the impurity region 120b (see FIG. 8A). The metal layer 122 can be formed by a variety of methods, such as vacuum deposition, sputtering, and spin coating. The metal layer 122 is preferably formed using a metal material that reacts with a semiconductor material included in the semiconductor region 104 to be a low-resistance metal compound. Examples of such metal materials include titanium, tantalum, tungsten, nickel, cobalt, and platinum.

Then, heat treatment is performed so that the metal layer 122 reacts with the semiconductor material of the surface in the semiconductor region 104. Thus, the metal compound region 124a and the metal compound region 124b are formed in contact with the impurity region 120a and the impurity region 120b (see FIG. 8A), respectively. Note that when the gate electrode 110a is formed using polycrystalline silicon or the like, a metal compound region is also formed in a region of the gate electrode 110a in contact with the metal layer 122. The metal compound region is a region having sufficiently increased conductivity. The formation of the metal compound regions can properly reduce electric resistance of the source, the drain, or the like and improve element characteristics of the transistor 160.

As the heat treatment, irradiation with a flash lamp can be employed, for example. Needless to say, another heat treatment method may be used. However, a method by which heat treatment for an extremely short time can be achieved is preferably used in order to improve the controllability of chemical reaction in formation of the metal compound. Note that the metal layer 122 is removed after the pair of metal compound regions 124a and 124b are formed.

Figure 8B:
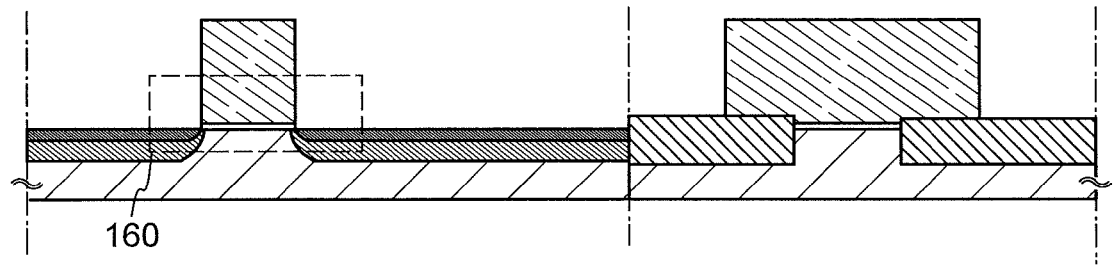

Through the above steps, the transistor 160 using the substrate 100 including a semiconductor material is formed (see FIG. 8B). The transistor 160 has a feature of operating at high speed. Therefore, with the use of transistor 160, the semiconductor device can read data at high speed.

Figure 8C:
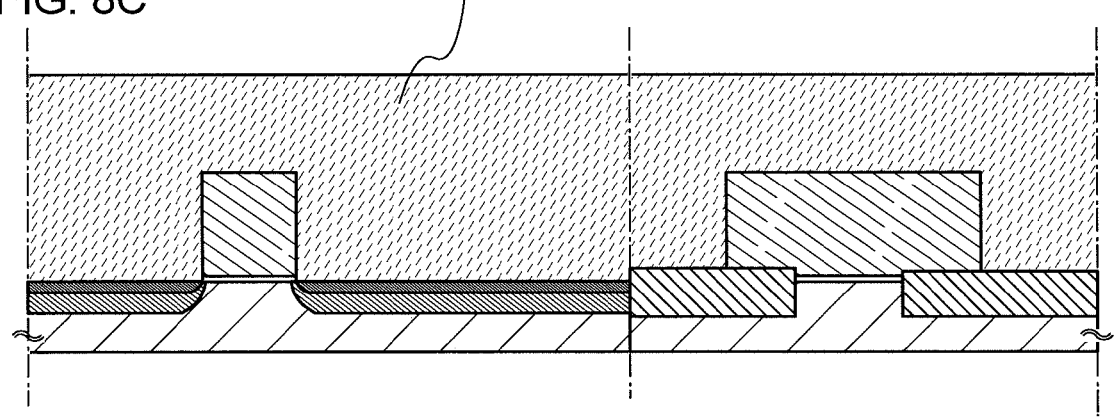

Next, the insulating layer 128 is formed so as to cover the transistor 160 formed in the above process (see FIG. 8C). The insulating layer 128 can be formed using a material including an inorganic insulating material such as silicon oxide, silicon oxynitride, silicon nitride, or aluminum oxide. In particular, a material with a low dielectric constant (a low-k material) is preferably used for the insulating layer 128, because capacitance caused by overlap of electrodes or wirings can be sufficiently reduced. Note that the insulating layer 128 may be a porous insulating layer formed using any of those materials. A porous insulating layer has a lower dielectric constant than an insulating layer with high density, and thus allows a further reduction in capacitance generated by electrodes or wirings. Further, the insulating layer 128 can be formed using an organic insulating material such as polyimide or acrylic. Note that although the insulating layer 128 has a single-layer structure here, one embodiment of the invention disclosed herein is not limited to this. The insulating layer 128 may have a stacked structure of two or more layers; for example, a stacked structure of a layer including an organic insulating material and a layer including an inorganic insulating material may be used.

Figure 8D:
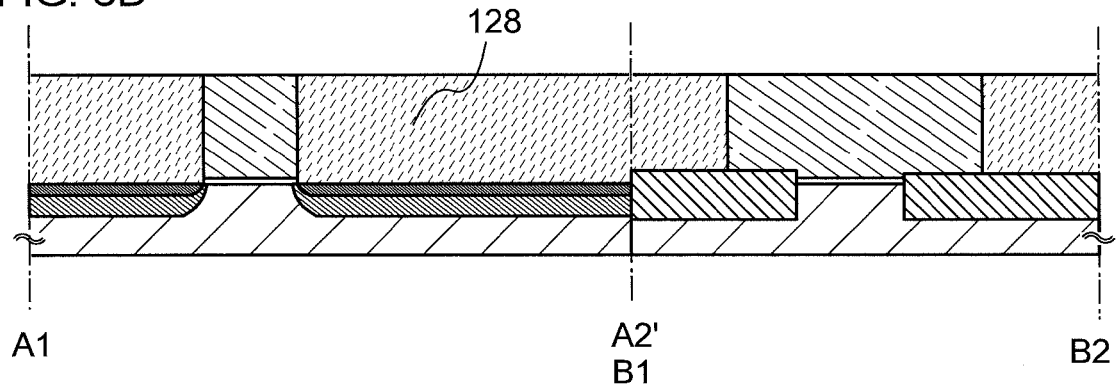

After that, as treatment performed before the transistor 162 and the capacitor 164 are formed, CMP treatment of the insulating layer 128 is performed so that the upper surface of the gate electrode 110 is exposed (see FIG. 8D). As treatment for exposing the upper surface of the gate electrode 110a, etching treatment or the like can be employed instead of the CMP treatment. Note that it is preferable to planarize the surface of the insulating layer 128 as much as possible in order to improve the characteristics of the transistor 162. For example, the surface of the insulating layer 128 preferably has a root-mean-square (RMS) roughness of 1 nm or less.

Note that before or after the steps described with reference to FIGS. 7A to 7E and FIGS. 8A to 8D, a step of forming an additional electrode, wiring, semiconductor layer, insulating layer, or the like may be performed. For example, a multilayer wiring structure in which an insulating layer and a conductive layer are stacked is employed as a wiring structure, whereby a highly integrated semiconductor device can be provided.

For example, although not illustrated, an opening which reaches a metal compound region of the selection transistor 180 or the selection transistor 182 formed in a similar manner to the transistor 160 may be formed in the insulating layer 128, and then, a wiring in contact with the metal compound region may be formed. For example, a wiring in contact with the metal compound region of the selection transistor 182 may be formed and the wiring may be the source line SL. A wiring in contact with the metal compound region of the selection transistor 180 may be formed and the wiring may be connected to the wiring 158 formed later.

<Method for Manufacturing Transistor in Upper Portion>

Next, a method for manufacturing the transistor 162 in the upper portion and the capacitor 164 will be described. A method for manufacturing the structure in FIGS. 5A to 5C (the structure in which the oxide semiconductor layer 144 is provided under the electrode 142) will be described with reference to FIGS. 9A to 9D. A method for manufacturing the structure in FIGS. 6A to 6C (the structure in which the oxide semiconductor layer 144 is provided over the electrode 142) will be described with reference to FIGS. 10A to 10D.

At first, a method for manufacturing the structure in FIGS. 5A to 5C (the structure in which the oxide semiconductor layer 144 is provided under the electrode 142) will be described with reference to FIGS. 9A to 9D.

Figure 9A:
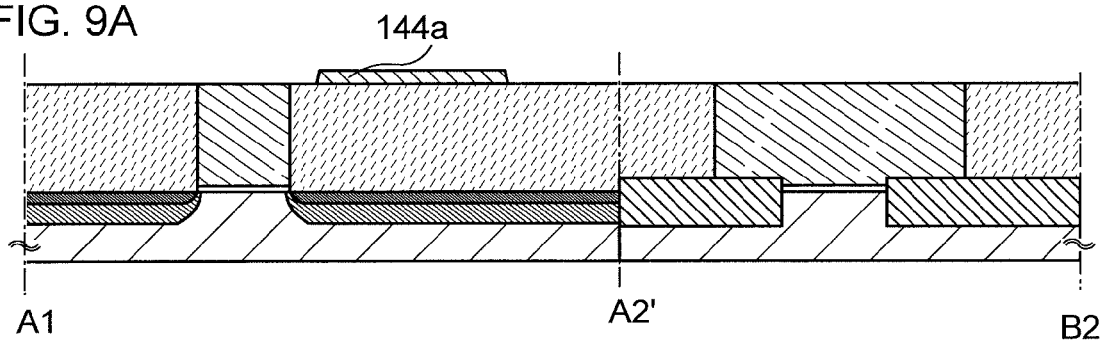
FIGS. 9A to 9D are diagrams illustrating a method for manufacturing a semiconductor device.

An oxide semiconductor layer is formed over the gate electrode 110*a* and the insulating layer 128, and is selectively etched to form the oxide semiconductor layer 144*a* (see FIG. 9A).

As the oxide semiconductor layer 144*a* can be formed using an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which is three-component metal oxide; an In—Zn—O-based oxide semiconductor, an In—Ga—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which is two-component metal oxide; an In—O-based oxide semiconductor, a Sn—O-based oxide semiconductor, or a Zn—O-based oxide semiconductor which is one-component metal oxide; or the like. In particular, an In—Ga—Zn—O-based oxide semiconductor has sufficiently high resistance when there is no electrical field and thus off-state current can be sufficiently reduced. In addition, with high field-effect mobility, the In—Ga—Zn—O-based oxide semiconductor material is suitable for a semiconductor device. In addition, any of the above oxide semiconductors may contain an element (e.g., $SiO_2$) other than In, Ga, Sn, and Zn.

Note that, for example, an In—Ga—Zn—O-based oxide semiconductor means an oxide film containing indium (In), gallium (Ga), and zinc (Zn), and there is no limitation on the composition ratio thereof.

As a typical example of the In—Ga—Zn—O-based oxide semiconductor material, one represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), or the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are only examples.

In the case of using In—Ga—Zn—O-based material for the oxide semiconductor and forming the oxide semiconductor layer by sputtering, a target having a composition ratio of In:Ga:Zn=1:x:y (x is greater than or equal to 0 and y is greater than or equal to 0.5 and less than or equal to 5) is preferably used. For example, a target having a composition ratio of In:Ga:Zn=1:1:1 [atomic ratio] (x=1, y=1) (that is, $In_2O_3$:$Ga_2O_3$:ZnO=1:1:2 [molar ratio]) can be used. In addition, a target having a composition ratio of In:Ga:Zn=1:1:0.5 [atomic ratio] (x=1, y=0.5), a target having a composition ratio of In:Ga:Zn=1:1:2 [atomic ratio] (x=1, y=2), or a target having a composition ratio of In:Ga:Zn=1:0:1 [atomic ratio] (x=0, y=1) can also be used. The relative density of a metal oxide in the metal oxide target is greater than or equal to 80%, preferably greater than or equal to 95%, more preferably greater than or equal to 99.9%. The use of the metal oxide target having high relative density makes it possible to form the oxide semiconductor layer 144*a* having a dense structure.

In the case where an In—Zn—O-based material is used as an oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas atmosphere, for example, from which an impurity such as hydrogen, water, a hydroxyl group, or hydride is removed to a concentration of 1 ppm or less (preferably, 10 ppb or less).

In forming the oxide semiconductor layer, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of the object in the formation of the oxide semiconductor layer may be room temperature (25° C.±10° C.). Then, a sputtering gas from which hydrogen, water, and the like are removed is introduced into the treatment chamber while moisture in the treatment chamber is removed, whereby the oxide semiconductor layer is formed using the above target. By forming the oxide semiconductor layer while heating the object, impurities in the oxide semiconductor layer can be reduced. In addition, damage on the oxide semiconductor layer 144*a* due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By performing evacuation with the use of a cryopump or the like, hydrogen, water, and the like can be removed from the treatment chamber; thus, the impurity concentration in the oxide semiconductor layer can be reduced.

The oxide semiconductor layer can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferably used because dust (such as powder substances generated in film formation) can be reduced and the film thickness of the oxide semiconductor layer can be made uniform.

Note that before the oxide semiconductor layer 144a is formed by sputtering, reverse sputtering in which plasma is generated with an argon gas introduced may be performed so that a material attached to a formation surface (e.g., a surface of the insulating layer 128) is removed. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

In this embodiment, the oxide semiconductor layer 144a is formed by sputtering using an In—Ga—Zn—O-based metal oxide target. The thickness of the oxide semiconductor layer 144a ranges from 1 nm to 50 nm, preferably from 2 nm to 20 nm, more preferably from 3 nm to 15 nm. Since the appropriate thickness differs depending on an oxide semiconductor material or the like, the thickness of the oxide semiconductor layer 144a can be selected in accordance with a material to be used. Note that when the surface of the insulating layer 128 is uniformed as much as possible as described above, even in the case of the oxide semiconductor layer 144a with a small thickness, the cross section of the portion of the oxide semiconductor layer 144a which corresponds to a channel formation region can be flat. When the portion corresponding to the channel formation region in the oxide semiconductor layer 144a has a planar cross-sectional shape, the leakage current of the transistor 162 can be lower than that in the case where the oxide semiconductor layer 144a does not have a planar cross-sectional shape.

After the oxide semiconductor layer 144a is formed, heat treatment (first heat treatment) is preferably performed on the oxide semiconductor layer 144a. Through the first heat treatment, excess hydrogen (including water or a hydroxyl group) in the oxide semiconductor layer 144a can be removed, the structure of the oxide semiconductor layer 144a can be ordered, and defect states in an energy gap can be reduced. The temperature of the first heat treatment is, for example, higher than or equal to 300° C. and lower than 550° C., preferably higher than or equal to 400° C. and lower than or equal to 500° C.

The heat treatment can be performed in such a manner that, for example, a process object is introduced into an electric furnace in which a resistance heating element or the like is used and heated at 450° C. under a nitrogen atmosphere for an hour. During the heat treatment, the oxide semiconductor layer is not exposed to the atmosphere to prevent the entry of water and hydrogen.

The heat treatment apparatus is not limited to the electric furnace and may be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because defect level in energy gap due to oxygen deficiency can be reduced by performing the first heat treatment in an atmosphere including oxygen. Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

The i-type (intrinsic) or substantially i-type oxide semiconductor layer 144a in which impurities are reduced by the first heat treatment is formed, which enables the transistor 162 to have extremely excellent characteristics.

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. Alkali metal is not an element included in an oxide semiconductor, and therefore, is an impurity. In addition, alkaline earth metal is impurity in the case where alkaline earth metal is not included in an oxide semiconductor. Alkali metal, in particular, Na becomes Na$^+$ when an insulating film in contact with the oxide semiconductor layer is an oxide and Na diffuses into the insulating layer. Further, in the oxide semiconductor layer, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor layer is very low. Therefore, when the hydrogen concentration in the oxide semiconductor layer is less than or equal to $1 \times 10^{18}$/ cm$^3$, preferably less than or equal to 1×10$^{17}$/cm$^3$, the concentration of the above impurity is preferably reduced. Specifically, a measurement value of a Na concentration by secondary ion mass spectrometry is preferably less than or equal to 5×10$^{16}$/cm$^3$, more preferably less than or equal to 1×10$^{16}$/cm$^3$, still more preferably less than or equal to 1×10$^{15}$/cm$^3$. In a similar manner, a measurement value of a Li concentration is preferably less than or equal to 5×10$^{15}$/cm$^3$, more preferably less than or equal to 1×10$^{15}$/cm$^3$. In a similar manner, a measurement value of a K concentration is preferably less than or equal to 5×10$^{15}$/cm$^3$, more preferably less than or equal to 1×10$^{15}$/cm$^3$.

Note that the oxide semiconductor layer may be amorphous or may have crystallinity. As an oxide semiconductor layer having crystallinity, a crystalline oxide semiconductor layer with c-axis orientation (also referred to as CAAC: c axis aligned crystalline oxide semiconductor) is also preferable because the effect of improving the reliability of a transistor can be obtained.

Sputtering may be performed to form an oxide semiconductor film including CAAC. In order to obtain CAAC by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made to be longer (e.g., 150 mm to 200 mm) and a substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition. Therefore, micro-defects in the film and defects at the interface of a stacked layer can be compensated.

Specifically, CAAC is non-single-crystal, has atoms arranged in a triangular, hexagonal, equilateral triangular, or regular hexagonal shape when seen from a direction perpendicular to an a-b plane, and have a phase in which metal atoms are arranged in layers in the c-axis direction or a phase in which metal atoms and oxygen atoms are arranged in layers in the c-axis direction In CAAC, metal atoms and oxygen atoms are bonded in an orderly manner in comparison with an amorphous oxide semiconductor. That is to say, in the case where an oxide semiconductor is amorphous, the coordination numbers might vary between various metal atoms, but the coordination numbers of metal atoms are almost the same as each other in CAAC. Therefore, microscopic defects of oxygen can be reduced and instability and moving of charge that are due to attachment and detachment of hydrogen atoms (including hydrogen ions) or alkali metal atoms can be reduced.

Accordingly, a transistor is formed using an oxide semiconductor film including CAAC, whereby the amount of shift of the threshold voltage of the transistor, which occurs after light irradiation and a bias-temperature (BT) stress test are performed on the transistor, can be reduced. Accordingly, a transistor having stable electric characteristics can be formed.

Figure 9B:
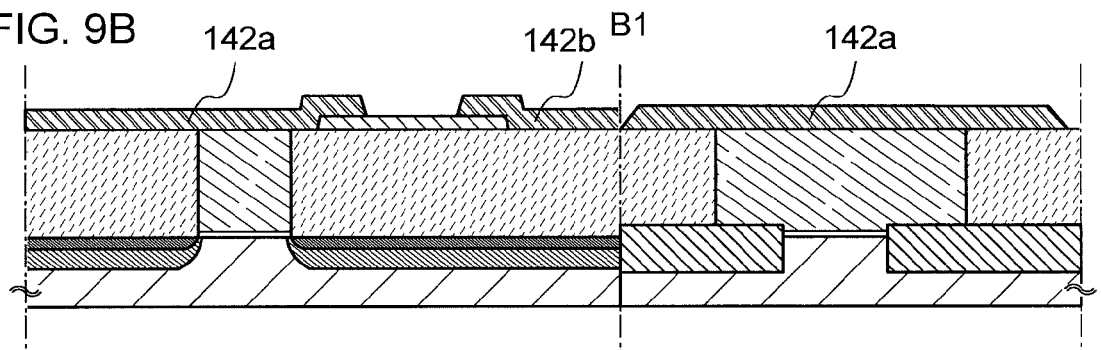

Next, a conductive layer is formed over the oxide semiconductor layer 144a and is selectively etched to form the electrode 142a and the electrode 142b (see FIG. 9B).

The conductive layer can be formed by PVD such as sputtering, or CVD such as plasma CVD. As a material for the conductive layer, an element selected from aluminum, chromium, copper, tantalum, titanium, molybdenum, or tungsten; an alloy containing any of these elements as a component; or the like can be used. Further, one or more materials selected from manganese, magnesium, zirconium, beryllium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the electrodes 142a and 142b having a tapered shape edge.

Alternatively, the conductive layer may be formed using conductive metal oxide. As the conductive metal oxide, indium oxide (In$_2$O$_3$), tin oxide (SnO$_2$), zinc oxide (ZnO), an indium oxide-tin oxide alloy (In$_2$O$_3$—SnO$_2$, which is abbreviated to ITO in some cases), an indium oxide-zinc oxide alloy (In$_2$O$_3$—ZnO), or any of these metal oxide materials including silicon or silicon oxide can be used.

Although either dry etching or wet etching may be performed as the etching of the conductive layer, dry etching with high controllability is preferably used for miniaturization. The etching may be performed so that the source electrode 142a and the drain electrode 142b to be formed have a tapered shape edge. The taper angle can be, for example, greater than or equal to 30° and less than or equal to 60°.

The channel length (L) of the upper transistor 162 is determined by a distance between a lower edge portion of the electrode 142a and a lower edge portion of the electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor 162 can be set to less than 2 μm, preferably in the range of 10 nm to 350 nm (0.35 μm), in which case the circuit can operate at higher speed.

The electrode 142a is one of the pair of electrodes of the capacitor 164.

Note that an insulating layer serving as a base of the transistor 162 may be provided over the interlayer insulating layer 128. The insulating layer can be formed by PVD, CVD, or the like.

Figure 9C:
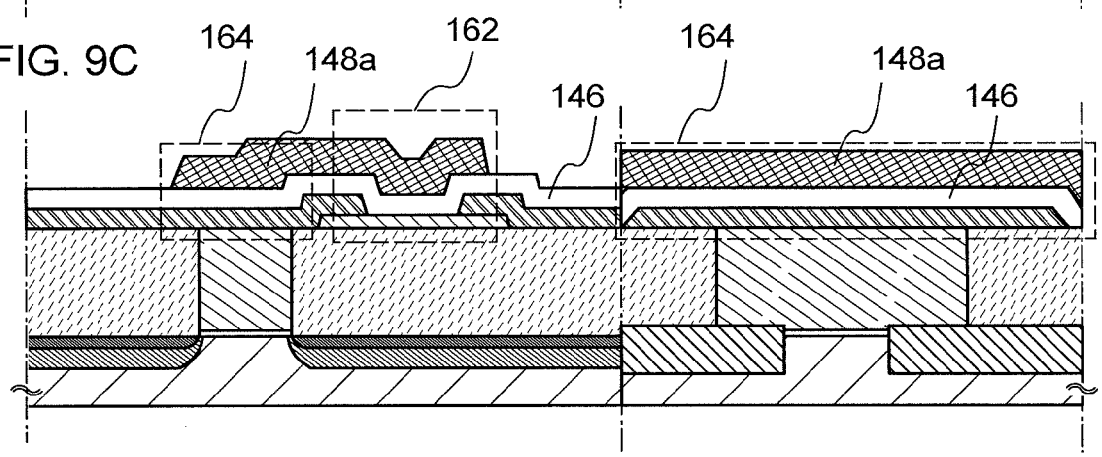

Next, the gate insulating layer 146 is formed so as to cover the electrode 142a, the electrode 142b, and the oxide semiconductor layer 144a (see FIG. 9C).

The gate insulating layer 146 can be formed by CVD, sputtering, or the like. The gate insulating layer 146 is preferably formed by a method in which hydrogen is sufficiently reduced because the gate insulating layer 146 is in contact with the oxide semiconductor layer 144a. The gate insulating layer 146 is preferably formed so as to contain silicon oxide, silicon nitride, silicon oxynitride, aluminum oxide, tantalum oxide, hafnium oxide, yttrium oxide, hafnium silicate (Hf-Si$_x$O$_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), or the like. The gate insulating layer 146 may have a single-layer structure or a stacked structure. The thickness of the gate insulating layer 146 is not particularly limited, but the gate insulating layer 146 is preferably thin in the case where the semiconductor device is miniaturized. For example, in the case where silicon oxide is used as the gate insulating layer 146, the thickness of the gate insulating layer 146 can be set to greater than or equal to 1 nm and less than or equal to 100 nm, preferably greater than or equal to 10 nm and less than or equal to 50 nm.

As described above, when the gate insulating layer 146 is thin, there is a problem of gate leakage of the transistor 162 due to a tunneling effect or the like. In order to solve the problem of gate leakage, a high dielectric constant (high-k) material such as hafnium oxide, tantalum oxide, yttrium oxide, hafnium silicate (HfSi$_3$O$_y$ (x>0, y>0)), hafnium silicate to which nitrogen is added (HfSi$_x$O$_y$N$_z$ (x>0, y>0, z>0)), or hafnium aluminate to which nitrogen is added (HfAl$_x$O$_y$N$_z$ (x>0, y>0, z>0)) is preferably used for the gate insulating layer 146. By using a high-k material for the gate insulating layer 146, electrical characteristics can be ensured and the thickness can be large to prevent gate leakage. For example, the relative permittivity of hafnium oxide is approximately 15, which is much higher than that of silicon oxide which is 3 to 4. With the use of such a high dielectric constant material, a gate insulating layer 146 having an equivalent oxide thickness of less than 15 nm, preferably greater than or equal to 2 nm and less than or equal to 10 nm, can be easily realized. Note that a layered structure of a film containing a high-k material and a film containing any one of silicon oxide, silicon nitride, silicon oxynitride, silicon nitride oxide, aluminum oxide, and the like may be employed.

After the gate insulating layer 146 is formed, second heat treatment is desirably performed in an inert gas atmosphere or an oxygen atmosphere. The temperature of the heat treatment is set in the range of 200° C. to 450° C., preferably 250° C. to 350° C. For example, the heat treatment may be performed at 250° C. for 1 hour in a nitrogen atmosphere. The second heat treatment can reduce variation in electric characteristics of the transistor 162. Further, in the case where the gate insulating layer 146 contains oxygen, oxygen is supplied to the oxide semiconductor layer 144a to cover oxygen deficiency in the oxide semiconductor layer 144a, so that an i-type (intrinsic semiconductor) or substantially i-type oxide semiconductor layer can be formed.

Note that in this embodiment, the second heat treatment is performed after the gate insulating layer 146 is formed; the timing of the second heat treatment is not limited thereto. For example, the second heat treatment may be performed after the gate electrode 148a is formed. Alternatively, the second heat treatment may be performed following the first heat treatment, the first heat treatment may double as the second heat treatment, or the second heat treatment may double as the first heat treatment. At least one of the first heat treatment and the second heat treatment is performed, whereby the oxide semiconductor layer 144a can be purified in order to include an impurity other than its main component as little as possible.

Further, the gate insulating layer 146 is the insulating layer of the capacitor 164.

Note that an insulating layer in contact with the oxide semiconductor layer 144a (in this embodiment, corresponding to the gate insulating layer 146, the insulating layer 128, an insulating layer which is provided over the insulating layer 128 and functions as a base of the transistor 162, or the like) is preferably formed of an insulating material containing a Group 13 element and oxygen. Many oxide semiconductor materials contain a Group 13 element, and an insulating material containing a Group 13 element works well with an oxide semiconductor. By using such an insulating material containing a Group 13 element for the insulating layer in contact with the oxide semiconductor, an interface with the oxide semiconductor can keep a favorable state.

An insulating material including a Group 13 element refers to an insulating material including one or more Group 13 elements. As the insulating material containing an element belonging to Group 13, a metal oxide such as gallium oxide, aluminum oxide, aluminum gallium oxide, and gallium aluminum oxide can be given for example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating layer in contact with an oxide semiconductor layer 144a containing gallium, a material containing gallium oxide may be used for the insulating layer, so that favorable characteristics can be kept at the interface between the oxide semiconductor layer 144a and the insulating layer. When the oxide semiconductor layer 144a and the insulating layer including gallium oxide are provided in contact with each other, hydrogen pileup at the interface between the oxide semiconductor layer 144a and the insulating layer can be reduced, for example. Note that a similar effect can be obtained in the case where an element in the same group as a constituent element of the oxide semiconductor is used in an insulating layer formed in contact with the oxide semiconductor layer 144a. Further, it is effective to form the insulating layer with the use of a material including aluminum oxide. Note that aluminum oxide has a property of not easily transmitting water. Thus, it is preferable to use a material including aluminum oxide in terms of preventing entry of water to the oxide semiconductor layer 144a.

Part of or the whole of the insulating layer in contact with the oxide semiconductor layer 144a preferably includes oxygen in a proportion higher than the insulating material included in an insulating layer in the stoichiometric composition by heat treatment under an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating layer in contact with the oxide semiconductor layer 144a is formed of gallium oxide, the composition of gallium oxide can be set to be Ga$_2$O$_x$ (x=3+α, 0<α<1) by heat treatment in an oxygen atmosphere or oxygen doping.

In the case where the insulating film in contact with the oxide semiconductor layer 144a is formed of aluminum oxide, the composition of aluminum oxide can be set to be Al$_2$O$_x$ (x=3+α, 0<α<1) by heat treatment in an oxygen atmosphere or oxygen doping.

In the case where the insulating layer in contact with the oxide semiconductor layer 144a is formed of gallium aluminum oxide (aluminum gallium oxide), the composition of gallium aluminum oxide (aluminum gallium oxide) can be set to be Ga$_x$Al$_{2-x}$O$_{3+\alpha}$ (0>x<2, 0<α<1) by heat treatment under an oxygen atmosphere or oxygen doping.

By oxygen doping treatment, an insulating layer which includes a region where the proportion of oxygen is higher than the insulating material included in the insulating layer in the stoichiometric composition can be formed. When such an insulating layer is in contact with the oxide semiconductor layer, oxygen that exists excessively in the insulating layer is supplied to the oxide semiconductor layer, and oxygen deficiency in the oxide semiconductor layer or at an interface between the oxide semiconductor layer and the insulating layer is reduced. Thus, an i-type or substantially i-type oxide semiconductor layer can be formed.

The insulating layer which includes a region where the proportion of oxygen is higher than the insulating material included in the insulating layer in the stoichiometric composition may be applied to either the insulating layer positioned on the upper side of the oxide semiconductor layer or the insulating layer positioned on the lower side of the oxide semiconductor layer of the insulating layers in contact with the semiconductor layer 144a. However, it is preferable to apply such an insulating layer to both of the insulating layers in contact with the semiconductor layer 144a. The advantageous effect described above can be further enhanced with a structure in which the insulating layers each including a region where the proportion of oxygen is higher than the insulating material included in the insulating layer in the stoichiometric composition are used as the insulating films in contact with and on the upper side and the lower side of the semiconductor layer 144a, in order that the semiconductor layer 144a may be interposed between the insulating layers.

The insulating layers on the upper side and the lower side of the semiconductor layer 144a may include the same constituent elements or different constituent elements. For example, the insulating layers on the upper side and the lower side may be both formed using gallium oxide whose composition is $Ga_2O_x$ ($x=3+\alpha$, $0<\alpha<1$). Alternatively, one of the insulating layers on the upper side and the lower side may be formed using $Ga_2O_x$ ($x=3+\alpha$, $0<\alpha<1$) and the other may be formed of aluminum oxide whose composition is $Al_2O_x$ ($x=3+\alpha$, $0<\alpha<1$).

The insulating layer in contact with the oxide semiconductor layer 144a may be formed by stacking insulating layers which include a region where the proportion of oxygen is higher than the insulating material included in the insulating layer in the stoichiometric composition. For example, the insulating film on the upper side of the oxide semiconductor layer 144a may be formed as follows: gallium oxide whose composition is $Ga_2O_x$ ($x=3+\alpha$, $0<\alpha<1$) is formed and gallium aluminum oxide (aluminum gallium oxide) whose composition is $Ga_xAl_{2-x}O_3$, ($0<x<2$, $0<\alpha<1$) may be formed thereover. Note that the insulating film on the lower side of the oxide semiconductor layer 144a may be formed by stacking insulating layers which include a region where the proportion of oxygen is higher than the insulating material included in the insulating layer in the stoichiometric composition. Further, both of the insulating films on the upper side and the lower side of the oxide semiconductor layer 144a may be formed by stacking insulating layers which include a region where the proportion of oxygen is higher than the insulating material included in the insulating layer in the stoichiometric composition.

Next, the gate electrode 148a is formed over the gate insulating layer 146 (see FIG. 9C).

The gate electrode 148a can be formed in such a manner that a conductive layer is formed over the gate insulating layer 146 and then selectively etched. The conductive layer to be the gate electrode 148a can be formed by PVD typified by sputtering or CVD such as plasma CVD. The details of a material or the like similar to those of the source electrode 142a, the drain electrode 142b, and the like; thus, description thereof can be referred to.

The gate electrode 148a is the other of the pair of electrodes of the capacitor 164.

Through the above steps, the transistor 162 including highly purified oxide semiconductor layer 144a and the capacitor 164 are completed (see FIG. 9C). By the above-described manufacturing method, in the oxide semiconductor layer 144a, the hydrogen concentration is sufficiently reduced so that the oxide semiconductor layer is highly purified and in which defect states in an energy gap due to oxygen deficiency are reduced by sufficiently supplying oxygen. The oxide semiconductor layer 144a formed in such a manner is intrinsic (i-type) or substantially intrinsic (i-type). The transistor 162 with excellent off-state current characteristics can be obtained by using such an oxide semiconductor layer 144a is used for the channel formation region. Therefore, with the use of the transistor 162 as a writing transistor, charge can be held for a long time.

Figure 9D:
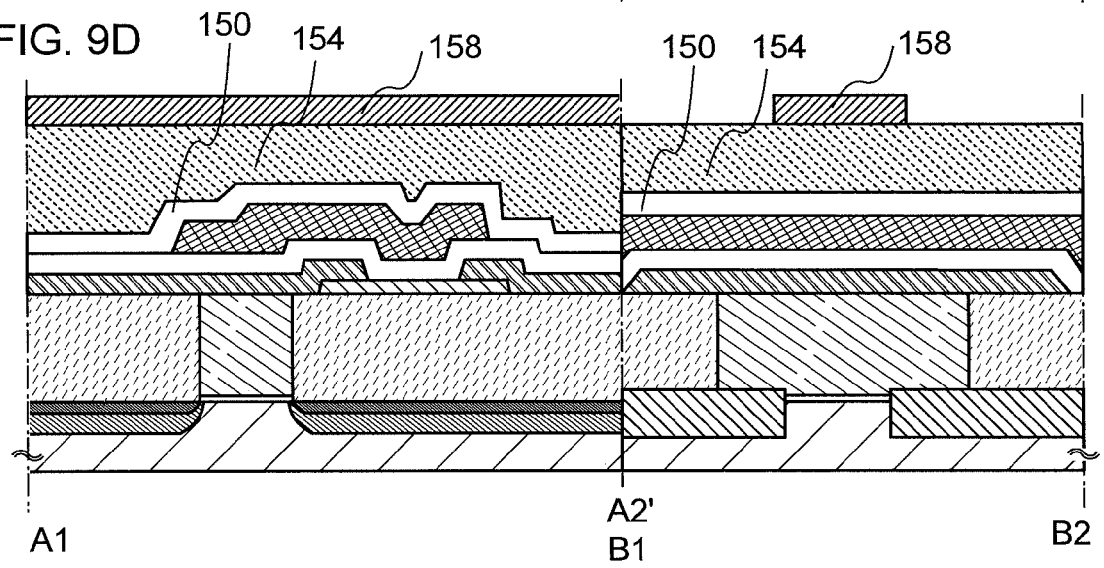

Next, the insulating layer 150 and the insulating layer 152 are formed over the gate insulating layer 146 and the gate electrode 148a (see FIG. 9D). The insulating layer 150 and the insulating layer 154 can be formed by PVD, CVD, or the like. The insulating layer 150 and the insulating layer 154 can be formed so as to have a single-layer structure or a stacked-layer structure using a material including an inorganic insulating material such as silicon oxide, silicon oxynitride, silicon nitride, hafnium oxide, or aluminum oxide.

Note that for the insulating layer 154, a material with a low dielectric constant may be preferably used or a structure with a low dielectric constant (e.g., a porous structure) may be preferably employed. This is because by reducing the dielectric constant of the insulating layer 154, capacitance between wirings and electrodes can be reduced, which will increase operation speed.

Note that the insulating layer 154 is preferably formed so as to have a planarized surface. By forming the insulating layer 154 having a planarized surface, an electrode, a wiring, or the like can be favorably formed over the insulating layer 154 even in the case where the semiconductor device is miniaturized, for example. The insulating layer 154 can be planarized by a method such as chemical mechanical polishing (CMP).

Next, the wiring 158 is formed (see FIG. 9D). The wiring 158 is formed by PVD typified by sputtering or CVD such as plasma CVD and then patterning the conductive layer. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used. The details are similar to those of the electrode 142a and the electrode 142b.

Note that although not illustrated, the wiring 158 is formed after an opening reaching the electrode 142a or the electrode 142b is formed in the insulating layer 150, the insulating layer 154, and the like, whereby a wiring connected to the source electrode or the drain electrode of the transistor 162 of the memory cell in the first row can be formed. Further, although not illustrated, the wiring 158 is formed after an opening is formed in the insulating layer 150, the insulating layer 154, and the like so as to reach a wiring electrically connected to the metal compound region of the selection transistor 180, whereby a wiring electrically connected to the source or the drain of the selection transistor 180 can be formed. The opening is formed by selective etching using a mask or the like.

The wiring 158 connected to the source electrode or the drain electrode of the transistor 162 and the wiring 158 electrically connected to the source or the drain of the selection transistor 180 each function as the bit line BL.

Through the above steps, the semiconductor device having the structure illustrated in FIGS. 5A to 5C can be manufactured.

Then, a method for manufacturing the structure in FIGS. 6A to 6C (the structure in which the oxide semiconductor layer 144 is provided over the electrode 142) will be described with reference to FIGS. 10A to 10D.

The manufacturing method illustrated in FIGS. 9A to 9D and that in FIGS. 10A to 10D are different in a method for manufacturing the oxide semiconductor layer 144 and the electrode 142. The manufacturing method illustrated in FIGS. 10A to 10D is similar to that in FIGS. 9A to 9D except the method for manufacturing the oxide semiconductor layer 144 and the electrode 142; therefore, the description is omitted.

Figure 10A:
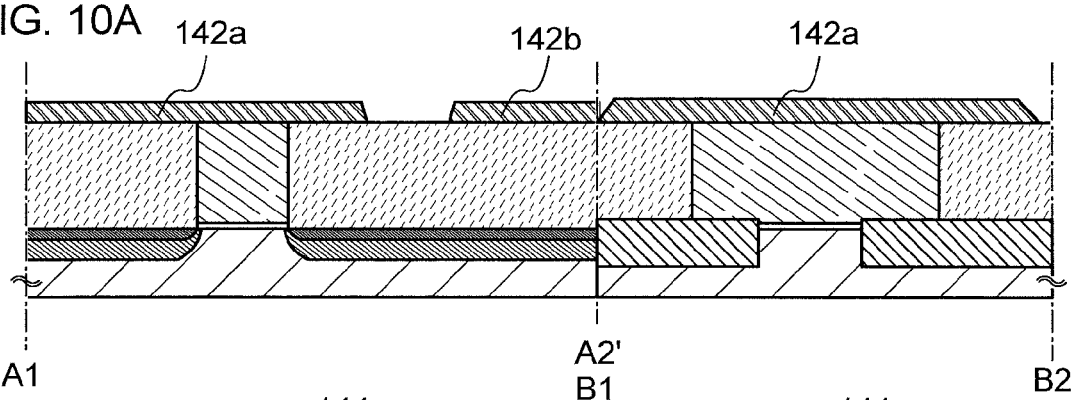
FIGS. 10A to 10D are diagrams illustrating a method for manufacturing a semiconductor device.

A conductive layer is formed over the gate electrode 110a and the insulating layer 128 and then selectively etched, whereby the electrode 142a and the electrode 142b are formed (see FIG. 10A). The conductive layer is formed using a material and a method which are similar to the conductive layer for forming the electrode 142a and the electrode 142b in the manufacturing method illustrated in FIGS. 9A to 9D; therefore, the description is omitted.

Figure 10B:
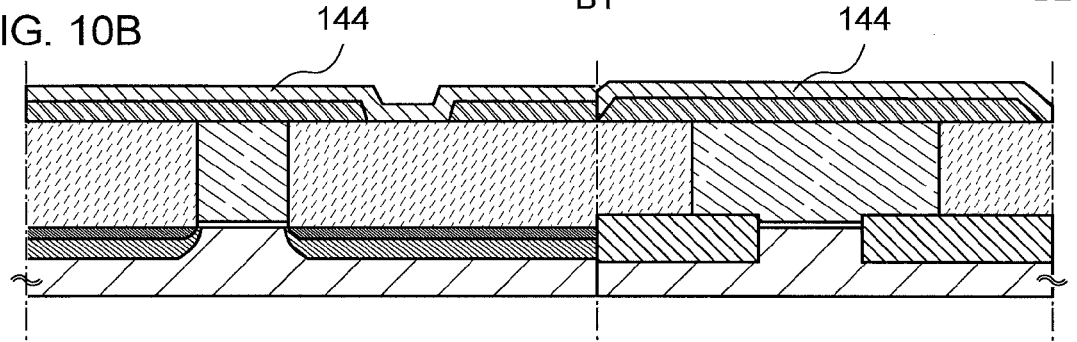

Next, the oxide semiconductor layer 144 is formed over the electrode 142a and the electrode 142b (see FIG. 10B). The oxide semiconductor layer 144 can have a shape extended to the column direction, differing from the manufacturing method shown in FIGS. 9A to 9D. The thickness of the insulator of the capacitor 164 can be larger because the oxide semiconductor layer 144 exists; thus, leakage current of the capacitor 164 can be reduced. Note that the oxide semiconductor layer 144 is forged using an oxide semiconductor layer and a method which are similar to the oxide semiconductor layer for forming the oxide semiconductor layer 144a in the manufacturing method shown in FIGS. 9A to 9D; therefore, the description is omitted.

Figure 10C:
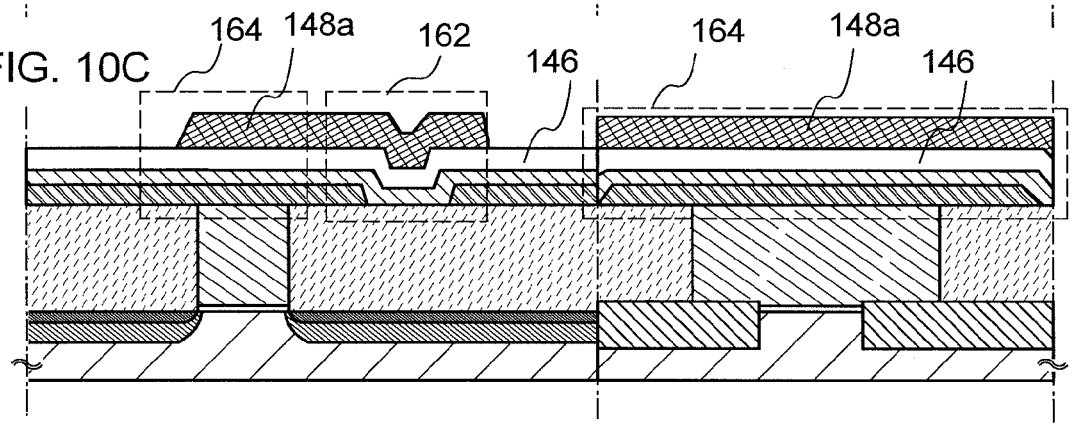
Figure 10D:
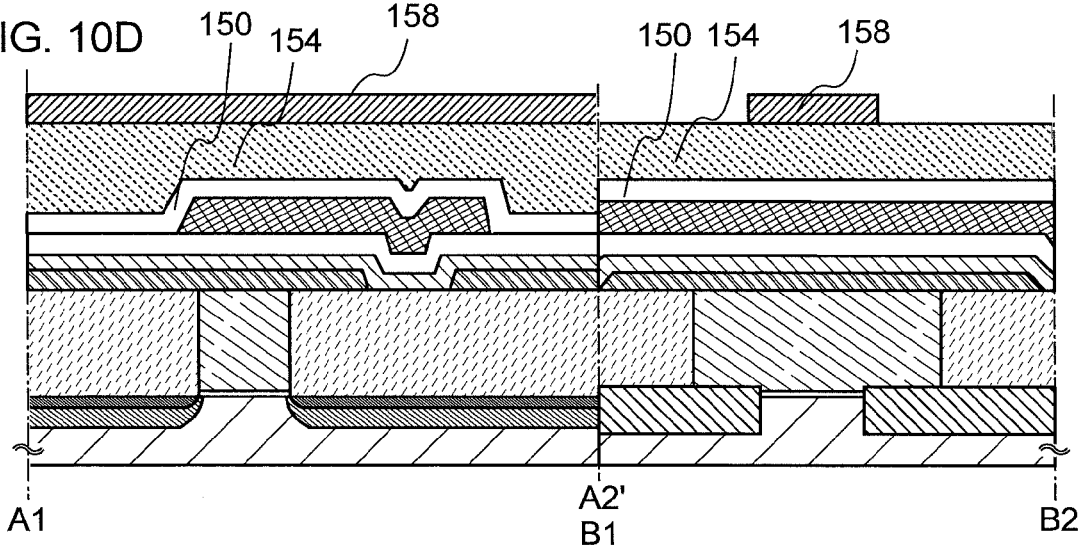

Next, the gate insulating layer 146 is formed to cover the electrode 142a, the electrode 142b, and the oxide semiconductor layer 144 (see FIG. 10C). A manufacturing process thereafter is similar to the process shown in FIGS. 9A to 9D; therefore, the description is omitted.

Through the above steps, the semiconductor device having the structure illustrated in FIGS. 6A and 6B can be manufactured.

Note that before or after the steps described with reference to FIGS. 9A to 9D and FIGS. 10A to 10D, a step of forming an additional electrode, wiring, semiconductor layer, insulating layer, or the like may be performed. For example, a multilayer wiring structure in which an insulating layer and a conductive layer are stacked is employed as a wiring structure, whereby a highly integrated semiconductor device can be provided.

The methods and structures described in this embodiment can be combined as appropriate with any of the methods and structures described in the other embodiments.

Embodiment 3

In this embodiment, the case where the semiconductor device described in the above embodiments is applied to electronic appliances will be described with reference to FIGS. 11A to 11F. In this embodiment, examples of the electronic device to which the above semiconductor device is applied include a computer, a mobile phone (also referred to as a mobile telephone or a mobile phone device), a personal digital assistant (including a portable game machine, an audio reproducing device, and the like), a digital camera, a digital video camera, an electronic paper, and a television device (also referred to as a television or a television receiver).

Figure 11A:
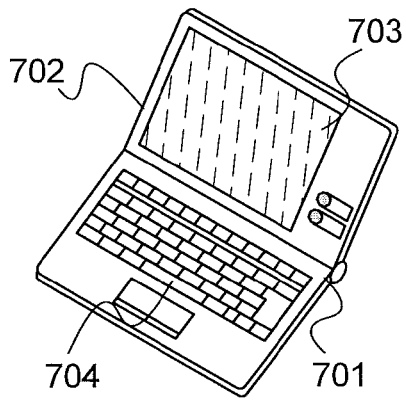
FIGS. 11A to 11F are diagrams each illustrate an electronic device including a semiconductor device.

FIG. 11A illustrates a laptop personal computer, which includes a housing 701, a housing 702, a display portion 703, a keyboard 704, and the like. The semiconductor device described in any of the above embodiments is provided in at least one of the housing 701 and the housing 702. Therefore, a personal digital assistant with sufficiently low power consumption in which writing and reading of data can be performed at high speed and data can be stored for a long time can be realized.

Figure 11B:
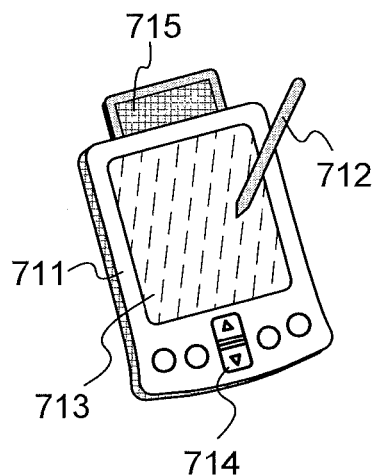

FIG. 11B illustrates a portable information terminal (PDA). A main body 711 is provided with a display portion 713, an external interface 715, operation buttons 714, and the like. Further, a stylus 712 and the like for operation of the portable information terminal are provided. In the main body 711, the semiconductor device described in any of the above embodiments is provided. Therefore, an e-book reader with sufficiently low power consumption in which writing and reading of data can be performed at high speed and data can be stored for a long time can be realized.

Figure 11C:
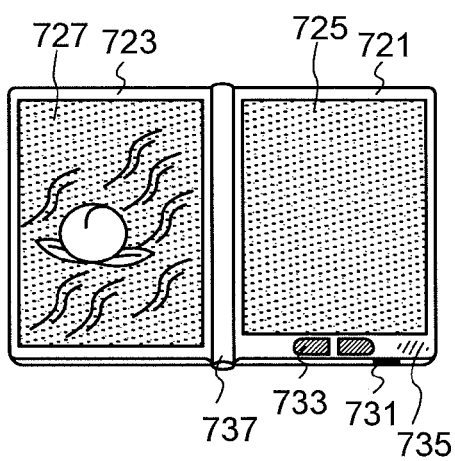

FIG. 11C illustrates an electronic book incorporating electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housings 721 and 723 is provided with the semiconductor device described in any of the above embodiments. Thus, a mobile phone with sufficiently low power consumption in which writing and reading of data can be performed at high speed and data can be stored for a long time can be realized.

Figure 11D:
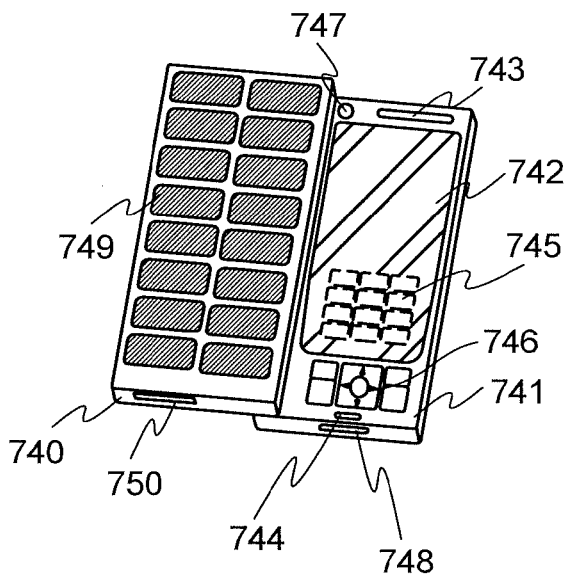

FIG. 11D illustrates a mobile phone set, which includes two housings, a housing 740 and a housing 741. Moreover, the housings 740 and 741 in a state where they are developed as illustrated in FIG. 11D can be slid so that one is lapped over the other. Therefore, the size of the mobile phone set can be reduced, which makes the mobile phone set suitable for being carried around. The housing 741 includes a display panel 742, a speaker 743, a microphone 744, an operation key 745, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. At least one of the housings 740 and 741 is provided with the semiconductor device described in any of the above embodiments. Therefore, a cellular phone in which writing and reading of data are performed at high speed, data is stored for a long time, and power consumption is sufficiently reduced can be realized.

Figure 11E:
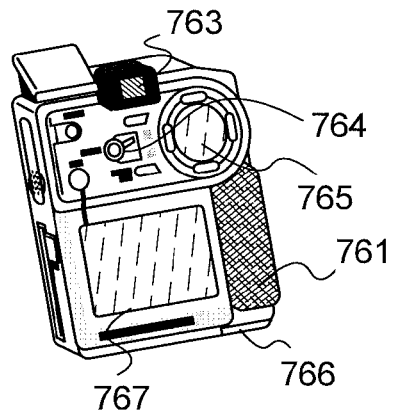

FIG. 11E illustrates a digital camera, which includes a main body 761, a display portion 767, an eyepiece 763, an operation switch 764, a display portion 765, a battery 766, and the like. In the main body 761, the semiconductor device described in any of the above embodiments is provided. Thus, a television set with sufficiently low power consumption in which writing and reading of data can be performed at high speed and data can be stored for a long time can be realized.

Figure 11F:
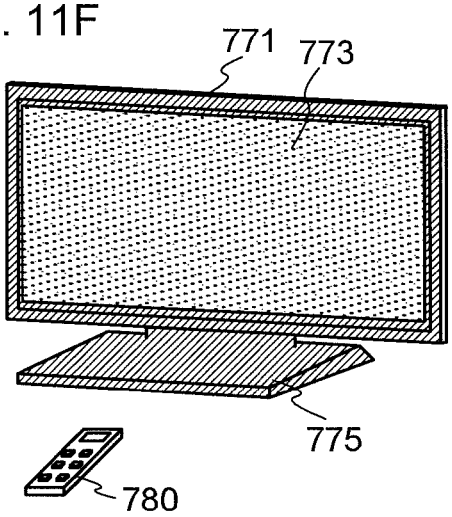

FIG. 11F is a television device including a housing 771, a display portion 773, a stand 775, and the like. Operation of the television set 770 can be performed with an operation switch of the housing 771 or a remote controller 780. The semiconductor device described in any of the above embodiments is mounted in the housing 771 and the remote controller 780. Thus, it is possible to realize a television device in which data is written and read at high speed, data can be retained for a long time, and power consumption is sufficiently low.

As described above, the electronic devices described in this embodiment each include the semiconductor device described in the above embodiment; thus, electronic devices with low power consumption can be realized.

EXPLANATION OF REFERENCES

100: substrate; 102: protective layer; 104: semiconductor region; 106: element isolation insulating layer; 108: gate insulating layer; 108a: gate insulating layer; 108b: gate insulating layer; 110: gate electrode; 110a: gate electrode; 110b: gate electrode; 116: channel formation region; 116a: channel formation region; 116b: channel formation region; 120: impurity region; 120a: impurity region; 120b: impurity region; 120c: impurity region; 122: metal layer; 124: metal compound region; 124a: metal compound region; 124b: metal compound region; 124c: metal compound region; 128: insulating layer; 142: electrode; 142a: electrode; 142b: electrode; 142c: electrode; 144: an oxide semiconductor layer; 144a: an oxide semiconductor layer; 144b: an oxide semiconductor layer; 146: gate insulating layer; 148: gate electrode; 148a: gate electrode; 148b: gate electrode; 150: insulating layer; 154: insulating layer; 158: wiring; 160: transistor; 162: transistor; 164: capacitor; 180: selection transistor; 182: selection transistor; 190: memory cell; 400: wiring; 401: transistor; 402: clocked inverter; 403: switch; 701: housing; 702: housing; 703: display portion; 704: keyboard; 711: main body; 712: stylus; 713: display portion; 714: operation button; 715: external interface; 721: housing; 723: housing; 725: display portion; 727: display portion; 731: power supply; 733: operation key; 735: speaker; 737: hinge; 740: housing; 741: housing; 742: display panel; 743: speaker; 744: microphone; 745: operation key; 746: pointing device; 747: camera lens; 748: external connection terminal; 749: solar cell; 750: external memory slot; 761: main body; 763: eyepiece; 764: operation switch; 765: display portion; 766: battery; 767: display portion; 771: housing; 773: display portion; 775: stand; 780: remote controller This application is based on Japanese Patent Application serial No. 2010-167836 filed with Japan Patent Office on Jul. 27, 2011, the entire contents of which are hereby incorporated by reference.

The invention claimed is:
1. A semiconductor device comprising:
a source line;
a bit line;
(m+1) word lines (m is a natural number greater than or equal to 2);
a selection line;
a first to an m-th memory cells connected in series between the source line and the bit line; and
a selection transistor including a gate terminal which is electrically connected to the selection line,
wherein each of the first to the m-th memory cells comprises:
a first transistor including a first gate terminal, a first source terminal, and a first drain terminal;
a second transistor including a second gate terminal, a second source terminal, and a second drain terminal; and
a capacitor,
the second transistor includes an oxide semiconductor layer,
a channel of the second transistor is formed in the oxide semiconductor layer, the source line is electrically connected to the first source terminal of the m-th memory cell through the selection transistor,
the bit line is electrically connected to the second drain terminal of the first memory cell and the first drain terminal of the first memory cell,
a k-th word line (k is a natural number greater than or equal to 1 and less than or equal to m) is electrically connected to the second gate terminal of a k-th memory cell,
a (k+1)-th word line is electrically connected to one of terminals of the capacitor of the k-th memory cell,
the second drain terminal of a j-th memory cell (j is a natural number greater than or equal to 2 and less than or equal to m) is electrically connected to the first gate terminal of a (j−1)-th memory cell, the second source terminal of the (j−1)-th memory cell, and the other of the terminals of the capacitor of the (j−1)-th memory cell,
the first gate terminal of the m-th memory cell, the second source terminal of the m-th memory cell, and the other of the terminals of the capacitor of the m-th memory cell are electrically connected to one another, and
the first drain terminal of the j-th memory cell is electrically connected to the first source terminal of the (j−1)-th memory cell.

2. The semiconductor device according to claim 1,
wherein the first transistor comprises:
a channel formation region provided in a substrate including a semiconductor material other than an oxide semiconductor;
a pair of impurity regions between the channel formation region;
a first gate insulating layer over the channel formation region;
a first gate electrode over the first gate insulating layer to overlap the channel formation region; and
a first source electrode electrically connected to one of the pair of impurity regions, and a second drain electrode electrically connected to the other of the pair of impurity regions,
the first gate electrode corresponds to the first gate terminal,
the first source electrode corresponds to the first source terminal.

3. The semiconductor device according to claim 2, wherein the substrate including a semiconductor material other than an oxide semiconductor is a single crystal semiconductor substrate or an SOI substrate.

4. The semiconductor device according to claim 1,
wherein the first transistor comprises:
a channel formation region formed over an insulating surface and provided over the semiconductor layer that includes a semiconductor material other than an oxide semiconductor;
a pair of impurity regions between the channel formation region;
a first gate insulating layer overlapping the channel formation region;
a first gate electrode which overlaps the channel formation region with the first gate insulating layer provided between the first gate electrode and the channel formation region; and
a first source electrode electrically connected to one of the pair of impurity regions, and a second drain electrode electrically connected to the other of the pair of impurity regions,
the first gate electrode corresponds to the first gate terminal, the first source electrode corresponds to the first source terminal.

5. The semiconductor device according to claim 1, wherein the second transistor comprises:
a second source electrode and the second drain electrode that are electrically connected to the oxide semiconductor layer;
a second gate insulating layer; and
a second gate electrode which overlaps the oxide semiconductor layer with the second gate insulating layer provided between the oxide semiconductor layer and the second gate insulating layer,
the second source electrode corresponds to the second source terminal, and
the second drain electrode corresponds to the second drain terminal.

6. The semiconductor device according to claim 5, wherein the second drain electrode of the j-th memory cell and the second source electrode of the (j−1)-th memory cell are formed using one conductive layer.

7. The semiconductor device according to claim 5, wherein the second drain electrode of the j-th memory cell, the second source electrode of the (j−1)-th memory cell, and the other of the terminals of the capacitor of the (j−1)-th memory cell are formed by using one conductive layer.

8. The semiconductor device according to claim 5, wherein the second drain electrode of the j-th memory cell, the second source electrode of the (j−1)-th memory cell, the other of the terminals of the capacitor of the (j−1)-th memory cell, and the first gate electrode of the (j−1)-th memory cell are formed by using one conductive layer.

9. The semiconductor device according to claim 1, wherein the oxide semiconductor layer includes an oxide semiconductor material including In, Ga, and Zn.

10. The semiconductor device according to claim 1, wherein the semiconductor device is one selected from the group consisting of a laptop personal computer, a portable information terminal, an electronic book, a mobile phone, a digital camera and a television device.

11. A semiconductor device comprising:
a source line;
a bit line;
(m+1) word lines (m is a natural number greater than or equal to 2);
a first selection line;
a second selection line;
a first to an m-th memory cells connected in series between the source line and the bit line;
a first selection transistor including a gate terminal which is electrically connected to the first selection line; and
a second selection transistor including a gate terminal which is electrically connected to the second selection line,
wherein each of the first to the m-th memory cells comprises:
a first transistor including a first gate terminal, a first source terminal, and a first drain terminal;
a second transistor including a second gate terminal, a second source terminal, and a second drain terminal; and
a capacitor,
the second transistor includes an oxide semiconductor layer,
a channel of the second transistor is formed in the oxide semiconductor layer,
the source line is electrically connected to the first source terminal of the m-th memory cell through the second selection transistor,
the bit line is electrically connected to the second drain terminal of the first memory cell and is electrically connected to the first drain terminal of the first memory cell through the first selection transistor,
a k-th word line (k is a natural number greater than or equal to 1 and less than or equal to m) is electrically connected to the second gate terminal of a k-th memory cell, and a (k+1)-th word line is electrically connected to one of terminals of the capacitor of the k-th memory cell,
the second drain terminal of a j-th memory cell (j is a natural number greater than or equal to 2 and less than or equal to in) is electrically connected to the first gate terminal of a (j−1)-th memory cell, the second source terminal of the (j−1)-th memory cell, and the other of the terminals of the capacitor of the (j−1)-th memory cell,
the first gate terminal of the m-th memory cell, the second source terminal of the m-th memory cell, and the other of the terminals of the capacitor of the m-th memory cell are electrically connected to one another, and
the first drain terminal of the j-th memory cell is electrically connected to the first source terminal of the (j−1)-th memory cell.

12. The semiconductor device according to claim 11, wherein the first transistor comprises:
a channel formation region provided in a substrate including a semiconductor material other than an oxide semiconductor;
a pair of impurity regions between the channel formation region;
a first gate insulating layer over the channel formation region;
a first gate electrode over the first gate insulating layer to overlap the channel formation region; and
a first source electrode electrically connected to one of the pair of impurity regions, and a second drain electrode electrically connected to the other of the pair of impurity regions,
the first gate electrode corresponds to the first gate terminal,
the first source electrode corresponds to the first source terminal.

13. The semiconductor device according to claim 12, wherein the substrate including a semiconductor material other than an oxide semiconductor is a single crystal semiconductor substrate or an SOI substrate.

14. The semiconductor device according to claim 11, wherein the first transistor comprises:
a channel formation region formed over an insulating surface and provided over the semiconductor layer that includes a semiconductor material other than an oxide semiconductor;
a pair of impurity regions between the channel formation region;
a first gate insulating layer overlapping the channel formation region;
a first gate electrode which overlaps the channel formation region with the first gate insulating layer provided between the first gate electrode and the channel formation region; and
a first source electrode electrically connected to one of the pair of impurity regions, and a second drain electrode electrically connected to the other of the pair of impurity regions, the first gate electrode corresponds to the first gate terminal, the first source electrode corresponds to the first source terminal.

15. The semiconductor device according to claim 11, wherein the second transistor comprises:
- a second source electrode and the second drain electrode that are electrically connected to the oxide semiconductor layer;
- a second gate insulating layer; and
- a second gate electrode which overlaps the oxide semiconductor layer with the second gate insulating layer provided between the oxide semiconductor layer and the second gate insulating layer, the second source electrode corresponds to the second source terminal, and the second drain electrode corresponds to the second drain terminal.

16. The semiconductor device according to claim 15, wherein the second drain electrode of the j-th memory cell and the second source electrode of the (j−1)-th memory cell are formed using one conductive layer.

17. The semiconductor device according to claim 15, wherein the second drain electrode of the j-th memory cell, the second source electrode of the (j−1)-th memory cell, and the other of the terminals of the capacitor of the (j−1)-th memory cell are formed by using one conductive layer.

18. The semiconductor device according to claim 15, wherein the second drain electrode of the j-th memory cell, the second source electrode of the (j−1)-th memory cell, the other of the terminals of the capacitor of the (j−1)-th memory cell, and the first gate electrode of the (j−1)-th memory cell are formed by using one conductive layer.

19. The semiconductor device according to claim 11, wherein the oxide semiconductor layer includes an oxide semiconductor material including In, Ga, and Zn.

20. The semiconductor device according to claim 11, wherein the semiconductor device is one selected from the group consisting of a laptop personal computer, a portable information terminal, an electronic book, a mobile phone, a digital camera and a television device.

* * * * *

UNITED STATES PATENT AND TRADEMARK OFFICE
CERTIFICATE OF CORRECTION

PATENT NO. : 8,357,963 B2
APPLICATION NO. : 13/185965
DATED : January 22, 2013
INVENTOR(S) : Kiyoshi Kato and Takjanori Matsuzaki It is certified that error appears in the above-identified patent and that said Letters Patent is hereby corrected as shown below:

In the Specifications:

Column 6, line 64, after "equal to" replace "in" with --m--;

Column 20, line 38, after "equal to" replace "in" with --m--;

Column 22, line 34, after "equal to" replace "in" with --m--;

Column 23, line 58, after "equal to" replace "in" with --m--;

Column 25, line 56, replace "faulted" with --formed--;

Column 30, line 11, replace "foaming" with --forming--;

Column 39, line 30, replace "forged" with --formed--;

In the Claims:

Column 44, line 15, in claim 11, after "equal to" replace "in" with --m--.

Signed and Sealed this
Twenty-third Day of April, 2013

Teresa Stanek Rea
*Acting Director of the United States Patent and Trademark Office*